(12) United States Patent
Chen

(10) Patent No.: US 11,777,012 B2
(45) Date of Patent: *Oct. 3, 2023

(54) METHOD FOR PREPARING SEMICONDUCTOR DEVICE WITH ANNULAR SEMICONDUCTOR FIN

(71) Applicant: NANYA TECHNOLOGY CORPORATION, New Taipei (TW)

(72) Inventor: Te-Yin Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/563,276

(22) Filed: Dec. 28, 2021

(65) Prior Publication Data

US 2022/0123127 A1 Apr. 21, 2022

Related U.S. Application Data

(62) Division of application No. 16/910,833, filed on Jun. 24, 2020, now Pat. No. 11,296,211.

(51) Int. Cl.
*H01L 29/66* (2006.01)
*H01L 29/417* (2006.01)
(Continued)

(52) U.S. Cl.
CPC ...... *H01L 29/66666* (2013.01); *H01L 21/027* (2013.01); *H01L 21/823431* (2013.01); *H01L 29/41791* (2013.01); *H01L 29/66795* (2013.01); *H01L 29/785* (2013.01); *H01L 29/7827* (2013.01)

(58) Field of Classification Search
CPC ............ H01L 29/66666; H01L 21/027; H01L 21/823431; H01L 29/41791; H01L 29/66795; H01L 29/785; H01L 29/78642; H01L 21/0334; H01L 21/3083; H01L 29/0847; H01L 29/41741; H01L 29/456; H01L 21/823487; H01L 29/66712–66734; H01L 29/7802–7815;
(Continued)

(56) References Cited

U.S. PATENT DOCUMENTS 10,720,509 B1 * 7/2020 Liao .................... H01L 29/4238
11,296,211 B2 * 4/2022 Chen .................... H01L 29/7827
(Continued)

*Primary Examiner* — Cuong B Nguyen
(74) *Attorney, Agent, or Firm* — Xuan Zhang

(57) ABSTRACT

A method for preparing a semiconductor device includes forming a ring structure over a semiconductor substrate, and etching the semiconductor substrate by using the ring structure as a mask to form an annular semiconductor fin. The method also includes epitaxially growing a first bottom source/drain structure within the annular semiconductor fin and a second bottom source/drain structure surrounding the annular semiconductor fin. The method further includes forming a first silicide layer over the first bottom source/drain structure and a second silicide layer over the second bottom source/drain structure. In addition, the method includes forming a first gate structure over the first silicide layer and a second gate structure over the second silicide layer, and epitaxially growing a top source/drain structure over the annular semiconductor fin.

14 Claims, 23 Drawing Sheets

(51) Int. Cl.
*H01L 29/78* (2006.01)
*H01L 21/8234* (2006.01)
*H01L 21/027* (2006.01)

(58) Field of Classification Search
CPC ..... H01L 29/7827–7828; H01L 51/057; H01L 27/1211
See application file for complete search history.

(56) References Cited

U.S. PATENT DOCUMENTS

| | | | |
|---|---|---|---|
| 2018/0122947 A1* | 5/2018 | Bergendahl | H01L 29/78642 |
| 2019/0386135 A1* | 12/2019 | Li | H01L 29/66666 |
| 2021/0020762 A1* | 1/2021 | Lin | H01L 29/6653 |
| 2021/0328051 A1* | 10/2021 | Wu | H01L 29/7827 |

* cited by examiner

METHOD FOR PREPARING SEMICONDUCTOR DEVICE WITH ANNULAR SEMICONDUCTOR FIN

CROSS-REFERENCE TO RELATED APPLICATION

This application is a divisional application of U.S. Non-Provisional Application Ser. No. 16/910,833 filed Jun. 24, 2020, which is incorporated herein by reference in its entirety.

TECHNICAL FIELD

The present disclosure relates to a method for preparing a semiconductor device, and more particularly, to a method for preparing a semiconductor device with an annular semiconductor fin.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device is provided. The method includes forming a ring structure over a semiconductor substrate, and etching the semiconductor substrate by using the ring structure as a mask to form an annular semiconductor fin. The method also includes epitaxially growing a first bottom source/drain structure within the annular semiconductor fin and a second bottom source/drain structure surrounding the annular semiconductor fin. The method further includes forming a first silicide layer over the first bottom source/drain structure and a second silicide layer over the second bottom source/drain structure. In addition, the method includes forming a first gate structure over the first silicide layer and a second gate structure over the second silicide layer, and epitaxially growing a top source/drain structure over the annular semiconductor fin.

In an embodiment, the second silicide layer covers a top surface and a sidewall of the second bottom source/drain structure. In an embodiment, the first gate structure is surrounded by the annular semiconductor fin, and the annular semiconductor fin is surrounded by the second gate structure. In an embodiment, the first gate structure and the second gate structure are in direct contact with sidewalls of the annular semiconductor fin. In an embodiment, the method further includes removing the ring structure after the first gate structure and the second gate structure are formed to expose a top surface of the annular semiconductor fin.

In an embodiment, the top source/drain structure is in direct contact with the top surface of the annular semiconductor fin. In an embodiment, the method further includes implanting dopants into a top surface of the semiconductor substrate exposed by the annular semiconductor fin to form a processed area, and forming an inner spacer on an inner sidewall of the annular semiconductor fin and an outer spacer on an outer sidewall of the annular semiconductor fin before the first bottom source/drain structure and the second bottom source/drain structure are grown. In an embodiment, the processed area is partially covered by the inner spacer and the outer spacer.

In another embodiment of the present disclosure, a method for preparing a semiconductor device is provided. The method includes forming a tubular vertical fin over a semiconductor substrate, and forming an inner spacer on an inner sidewall of the tubular vertical fin and an outer spacer on an outer sidewall of the tubular vertical fin. The method also includes etching the semiconductor substrate to form a first recess and a second recess surrounding the first recess. The inner spacer and the outer spacer are between the first recess and the second recess. The method further includes epitaxially growing a first bottom source/drain structure in the first recess and a second bottom source/drain structure in the second recess. In addition, the method includes forming a first gate structure over the first bottom source/drain structure and a second gate structure over the second bottom source/drain structure, and epitaxially growing a top source/drain structure over the tubular vertical fin.

In an embodiment, the formation of the tubular vertical fin further includes forming a cylindrical structure over the semiconductor substrate, and forming a ring structure surrounding and in direct contact with the cylindrical structure. In addition, the formation of the tubular vertical fin includes removing the cylindrical structure to form an opening in the ring structure, and performing an etching process on the semiconductor substrate by using the ring structure as a mask to form the tubular vertical fin. In an embodiment, the method further includes implanting dopants into a top surface of the semiconductor substrate exposed by the tubular vertical fin to form a processed area before the inner spacer and the outer spacer are formed.

In an embodiment, the method further includes forming a first silicide layer over the first bottom source/drain structure and a second silicide layer over the second bottom source/drain structure before the first gate structure and the second gate structure are formed, wherein the second silicide layer covers and surrounds the second bottom source/drain structure. In an embodiment, the first silicide layer is in contact with the inner spacer, and the second silicide layer is in contact with the outer spacer. In an embodiment, the method also includes removing the inner spacer and the outer spacer after the first silicide layer and the second silicide layer are formed, forming a bottom spacer layer to cover the first silicide layer and the second silicide layer, and forming a top spacer layer over the bottom spacer layer, wherein the first gate structure and the second gate structure are sandwiched between the bottom spacer layer and the top spacer layer.

In yet another embodiment of the present disclosure, a method for preparing a semiconductor device is provided. The method includes forming a ring structure over a semiconductor substrate, and etching the semiconductor substrate by using the ring structure as a mask to form an annular vertical fin. The method also includes forming an inner spacer on an inner sidewall of the annular vertical fin and an outer spacer on an outer sidewall of the annular vertical fin. The method further includes etching the semiconductor substrate by using the ring structure, the inner spacer and the outer spacer as a mask to form a first recess within the annular vertical fin and a second recess surrounding the annular vertical fin. In addition, the method includes epitaxially growing a first bottom source/drain structure in the first recess and a second bottom source/drain structure in the second recess, and forming a first silicide layer to cover the first bottom source/drain structure and a second silicide layer to cover and surround the second bottom source/drain structure. The method also includes forming a first gate structure over the first silicide layer and a second gate structure over the second silicide layer, and epitaxially growing a top source/drain structure over the annular vertical fin.

In an embodiment, the method further includes implanting dopants into a top surface of the semiconductor substrate exposed by the annular vertical fin to form a processed area before the inner spacer and the outer spacer are formed, wherein the processed area is etched during the formation of the first recess and the second recess, and the first recess and the second recess expose sidewalls of the processed area. In an embodiment, the first bottom source/drain structure and the second bottom source/drain structure are in direct contact with the processed area. In an embodiment, the method further includes removing the inner spacer and the outer spacer after the first silicide layer and the second silicide layer are formed, and forming a bottom spacer layer to cover the first silicide layer and the second silicide layer before the first gate structure and the second gate structure are formed.

In an embodiment, a top surface of the first silicide layer and a top surface of the second silicide layer are higher than a bottom surface of the bottom spacer layer. In an embodiment, the method further includes forming a top spacer layer to cover the first gate structure and the second gate structure before the top source/drain structure is epitaxially grown, wherein the top spacer layer is in direct contact with sidewalls of the ring structure, and removing the ring structure and a portion of the top spacer layer to expose a top surface and a sidewall of the annular vertical fin before the top source/drain structure is epitaxially grown.

Embodiments of a method for preparing a semiconductor device are provided in the disclosure. The method includes etching a semiconductor substrate by using a ring structure as a mask to form an annular semiconductor fin, and forming a transistor (e.g., a vertical field effect transistor (FET)) by using the annular semiconductor fin as a vertical channel. As a result, the integration density of the semiconductor device may be significantly increased. Moreover, the method also includes forming a first gate structure within the annular semiconductor fin and a second gate structure surrounding the annular semiconductor fin. Therefore, the control of the current in the annular semiconductor fin may be improved, thus upgrading the device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
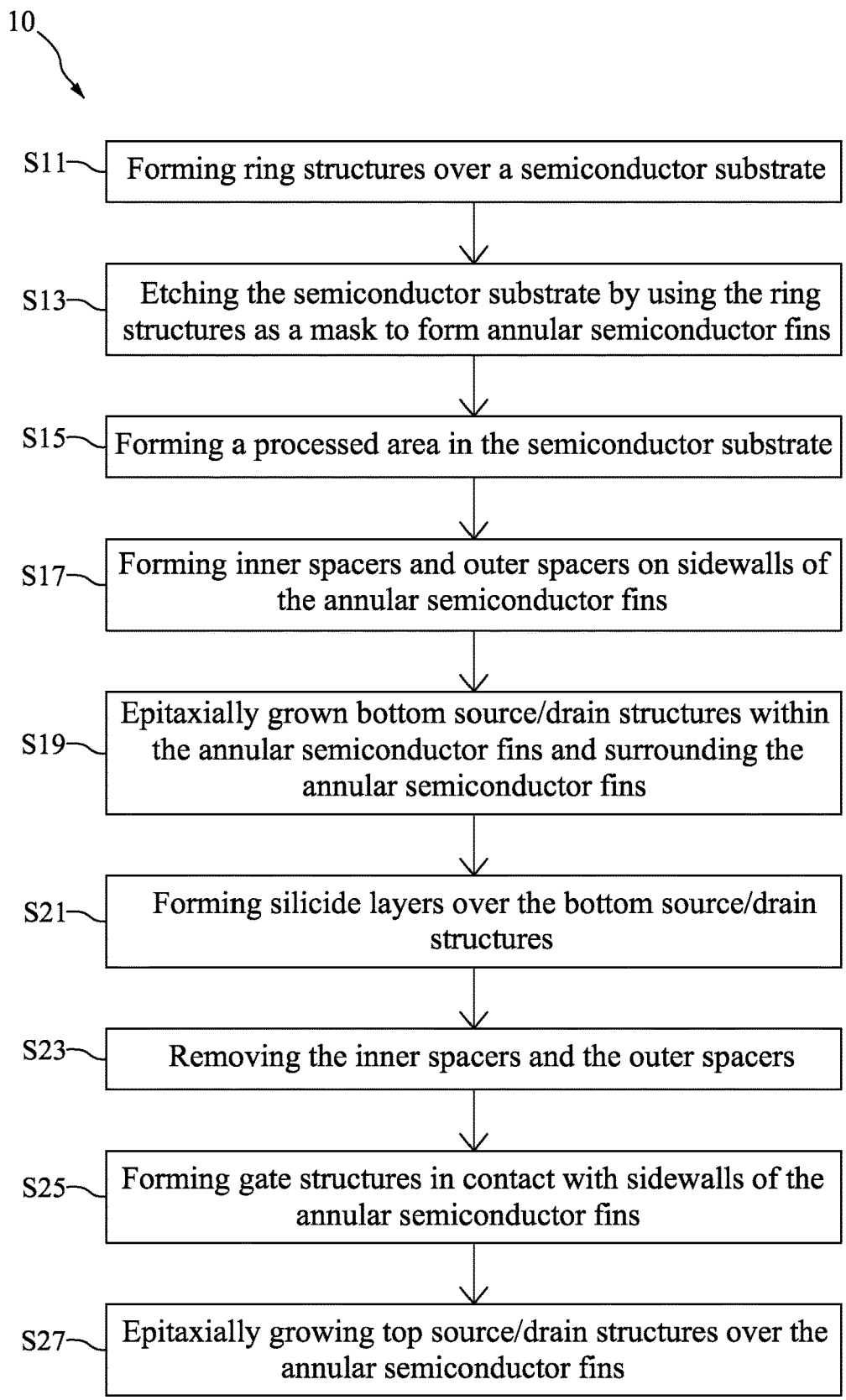
FIG. 1 is a flow diagram illustrating a method for preparing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for preparing a semiconductor device 100, and the method 10 includes steps S11, S13, S15, S17, S19, S21, S23, S25, and S27, in accordance with some embodiments. The steps S11 to S27 of FIG. 1 are first introduced briefly and then elaborated in connection with the following figures.

As shown in FIG. 1, the method 10 begins at step S11 where ring structures are formed over a semiconductor substrate, and at step S13, the semiconductor substrate is etched by using the ring structures as a mask, such that annular semiconductor fins are formed. In some embodiments, a top surface of the semiconductor substrate is exposed by the annular semiconductor fins. Then, at step S15, a processed area is formed in the semiconductor substrate. In some embodiments, in order to form the processed area, dopants are implanted into the top surface of the semiconductor substrate exposed by the annular semiconductor fins.

At step S17, inner spacers and outer spacers are formed on sidewalls of the annular semiconductor fins. In some embodiments, the inner spacers are formed on inner sidewalls of the annular semiconductor fins, and the outer spacers are formed on outer sidewalls of the annular semiconductor fins. At step S19, bottom source/drain structures are epitaxially grown within the annular semiconductor fins and surrounding the annular semiconductor fins. In some embodiments, the semiconductor substrate (including the processed area) is further etched to form recesses within the annular semiconductor fins and surrounding the annular semiconductor fins, and the bottom source/drain structures are epitaxially grown in the recesses.

Still referring to FIG. 1, at step S21, silicide layers are formed over the bottom source/drain structures. In some embodiments, the bottom source/drain structures surrounding the annular semiconductor fins are covered and surrounded by the silicide layers. At step S23, the inner spacers and the outer spacers are removed. In some embodiments, the inner sidewalls and the outer sidewalls of the annular semiconductor fins are exposed. Next, at step S25, gate structures are formed in contact with sidewalls of the annular semiconductor fins. In some embodiments, the inner sidewalls and the outer sidewalls of the annular semiconductor fins are in direct contact with the gate structures.

At step S27, top source/drain structures are epitaxially grown over the annular semiconductor fins. In some embodiments, ring structures over the annular semiconductor fins are removed before the top source/drain structures are grown, and top surfaces of the annular semiconductor fins are in direct contact with the top source/drain structures. After the top source/drain structures are grown, the semiconductor device 100 is obtained. In some embodiments, the semiconductor device 100 includes vertical field effect transistors, and each of the annular semiconductor fins is a vertical channel with source/drain structures at ends of the channel on top and bottom sides of the fin. Specifically, the current flows through the annular semiconductor fin along a vertical direction. For example, from a bottom source/drain structure to a top source/drain structure.

Figure 2:
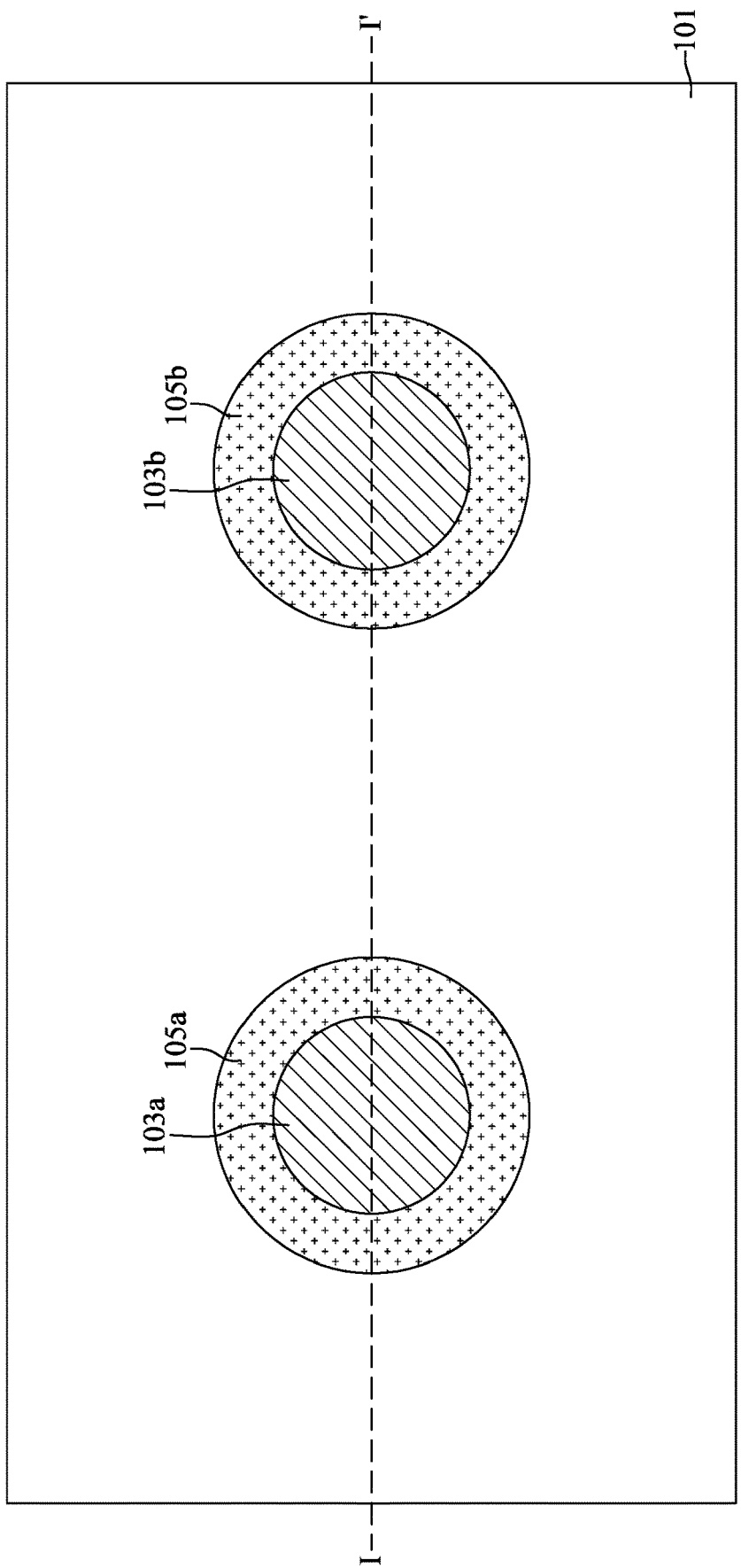
FIG. 2 is a top view illustrating an intermediate stage of forming cylindrical structures and ring structures over a semiconductor substrate during the formation of the semiconductor device, in accordance with some embodiments.
Figure 3:
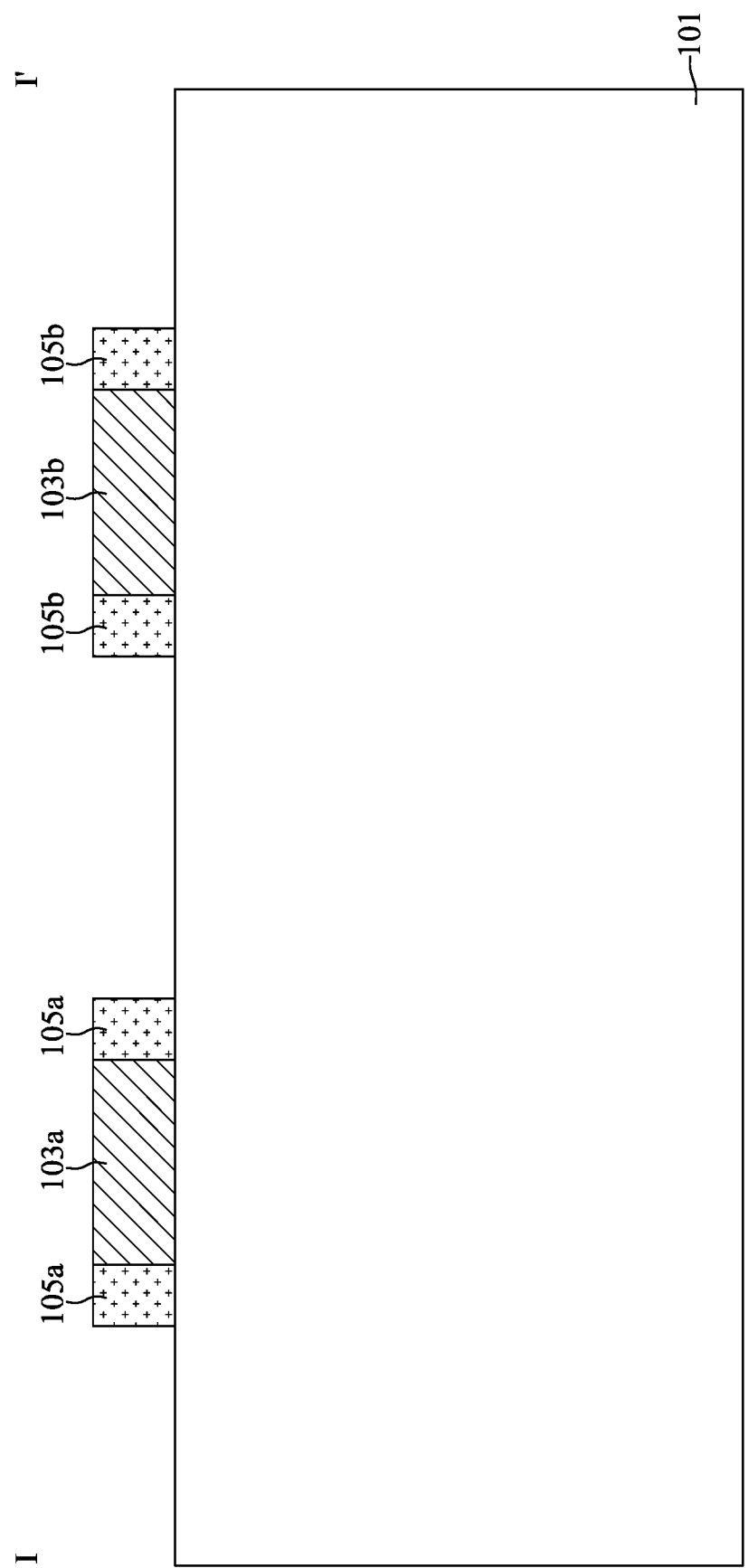
FIG. 3 is a cross-sectional view illustrating an intermediate stage of forming cylindrical structures and ring structures over a semiconductor substrate during the formation of the semiconductor device along the sectional line I-I' in FIG. 2, in accordance with some embodiments.
Figure 4:
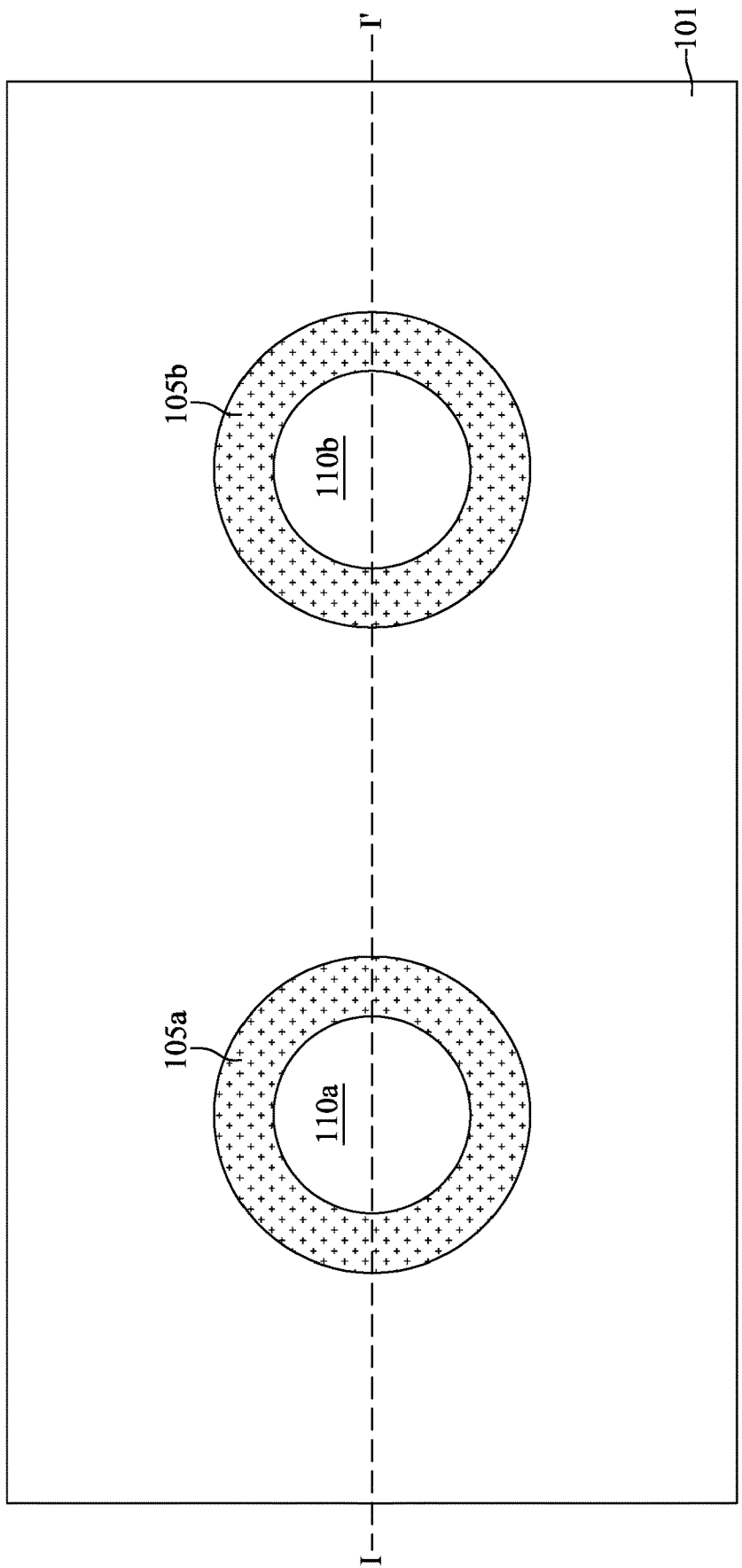
FIG. 4 is a top view illustrating an intermediate stage of removing the cylindrical structures during the formation of the semiconductor device, in accordance with some embodiments.
Figure 5:
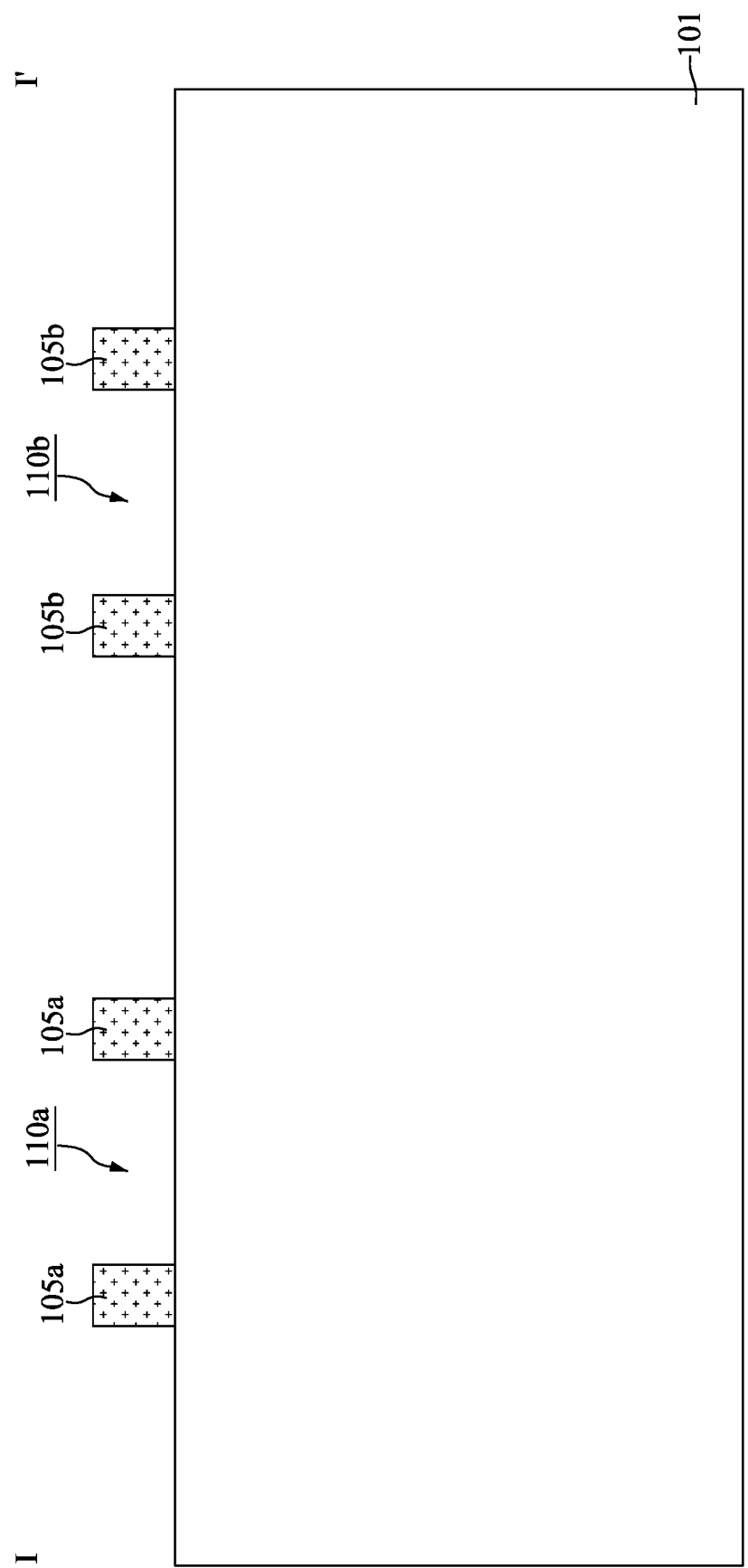
FIG. 5 is a cross-sectional view illustrating an intermediate stage of removing the cylindrical structures during the formation of the semiconductor device along the sectional line I-I' in FIG. 4, in accordance with some embodiments.

FIGS. 2 and 4 are top views illustrating intermediate stages of forming ring structures 105a, 105b over a semiconductor substrate 101 during the formation of the semiconductor device 100, in accordance with some embodiments. FIG. 3 is a cross-sectional view taken along the sectional line I-I' in FIG. 2, and FIG. 5 is a cross-sectional view taken along the sectional line I-I' in FIG. 4, in accordance with some embodiments. The respective step is illustrated as the step S11 in the method 10 shown in FIG. 1.

As shown in FIGS. 2 and 3, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other applicable methods.

Still referring to FIGS. 2 and 3, cylindrical structures 103a, 103b are formed over the semiconductor substrate 101, in accordance with some embodiments. In some embodiments, the cylindrical structures 103a and 103b are made of dielectric materials. In some embodiments, the cylindrical structures 103a and 103b include silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof.

In addition, the cylindrical structures 103a and 103b are formed by a deposition process and a patterning process. For example, a material layer (not shown) may be deposited over the semiconductor substrate 101, and the material layer may be patterned to form cylindrical structures 103a and 103b. The deposition process may include a chemical vapor deposition (CVD) process, a physical vapor deposition (PVD) process, an atomic layer deposition (ALD) process, a spin-on process, another applicable process, or a combination thereof.

In some embodiments, the patterning process includes a photolithography processes and a subsequent etching process. The photolithography process may form photoresist patterns (not shown) on a top surface of the material layer. The photolithography process may include photoresist coating (e.g. spin-on coating), soft baking, mask aligning, exposure, post-exposure baking, developing the photoresist, rinsing and drying (e.g. hard baking). In some embodiments, the etching process is a dry etching process, a wet etching process, or a combination thereof.

Moreover, the ring structures 105a, 105b are formed surrounding the cylindrical structures 103a, 103b, as shown in FIGS. 2 and 3 in accordance with some embodiments. Specifically, sidewalls of the cylindrical structure 103a are entirely surrounded and in direct contact with the ring structure 105a, and sidewalls of the cylindrical structure 103b are entirely surrounded and in direct contact with the ring structure 105b. Some materials and processes used to form the ring structures 105a and 105b are similar to, or the same as, those used to form the cylindrical structures 103a and 103b, and details thereof are not repeated herein. However, it should be noted that, the materials of the ring structures 105a and 105b are different from the materials of the cylindrical structures 103a and 103b.

Then, the cylindrical structure 103a and 103b are removed to form openings 110a and 110b in the ring structures 105a and 105b, as shown in FIGS. 4 and 5 in accordance with some embodiments. In some embodiments, the opening 110a is entirely surrounded by the ring structure 105a, and the opening 110b is entirely surrounded by the ring structure 105b. In some embodiments, the cylindrical structures 103a and 103b are removed by an etching process, such as a dry etching process. As described previously, the materials of the cylindrical structures 103a, 103b are different from the materials of the ring structures 105a, 105b, and the materials are selected such that the etching selectivity of the cylindrical structures 103a, 103b with respect to the ring structures 105a, 105b is high. Therefore, the cylindrical structures 103a and 103b are removed by the etching process while the ring structures 105a and 105b may be substantially left, and the openings 110a and 110b are obtained.

Figure 6:
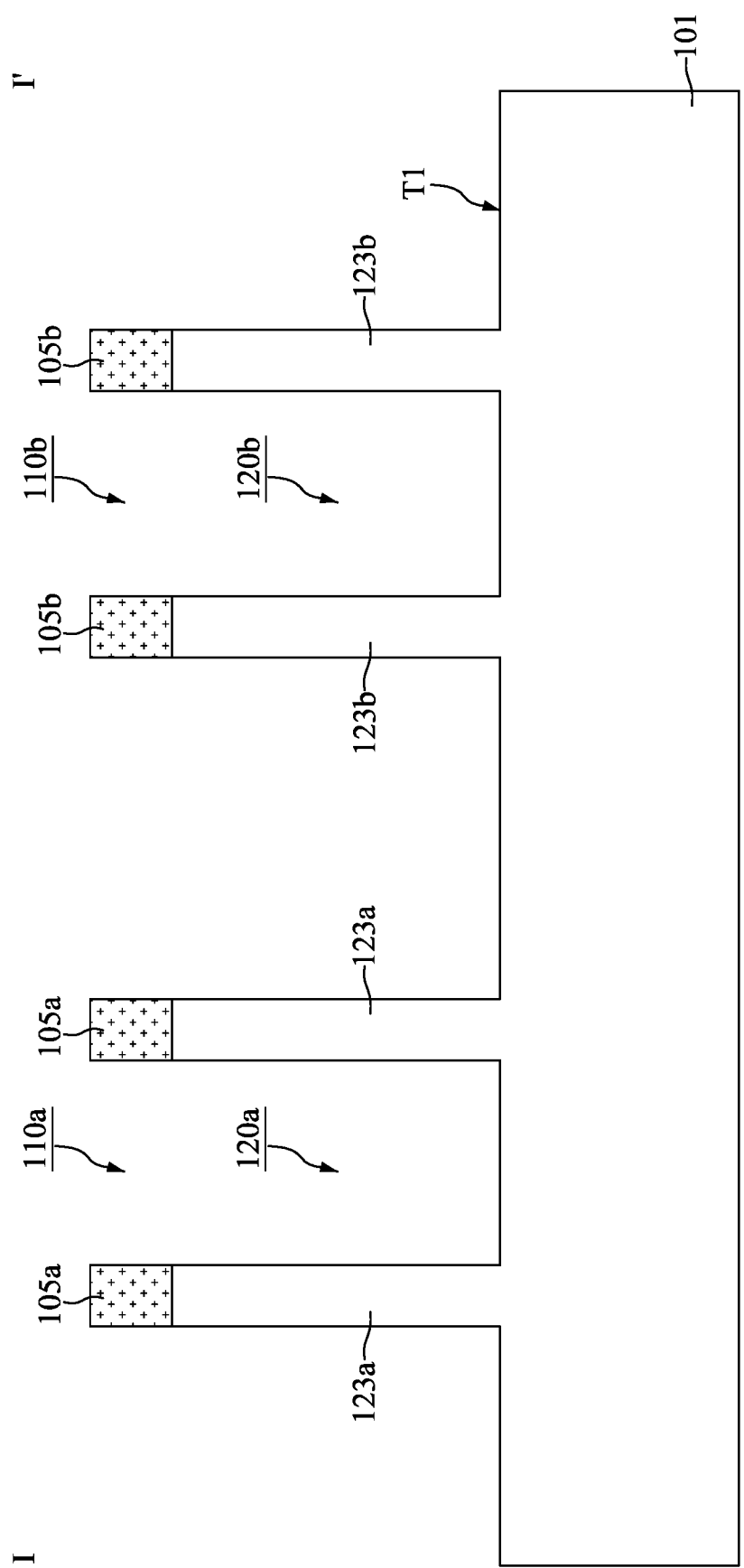
FIG. 6 is a cross-sectional view illustrating an intermediate stage of etching the semiconductor substrate to form annular semiconductor fins during the formation of the semiconductor device, in accordance with some embodiments.

FIG. 6 is a cross-sectional view illustrating an intermediate stage of etching the semiconductor substrate 101 to form annular semiconductor fins 123a and 123b during the formation of the semiconductor device 100, in accordance with some embodiments. The respective step is illustrated as the step S13 in the method 10 shown in FIG. 1. The annular semiconductor fins 123a and 123b are also referred to as annular vertical fins or tubular vertical fins.

Subsequently, the semiconductor substrate 101 is etched by using the ring structures 105a and 105b as a mask to form the annular semiconductor fins 123a and 123b, as shown in FIG. 6 in accordance with some embodiments. In some embodiments, openings 120a and 120b under the openings 110a and 110b are formed in the semiconductor substrate 101 and surrounded by the annular semiconductor fins 123a and 123b. Moreover, the top surface T1 of the semiconductor substrate 101 is exposed by the annular semiconductor fins 123a and 123b. In some embodiments, the semiconductor substrate 101 is etched by a dry etching process or a wet etching process.

Figure 7:
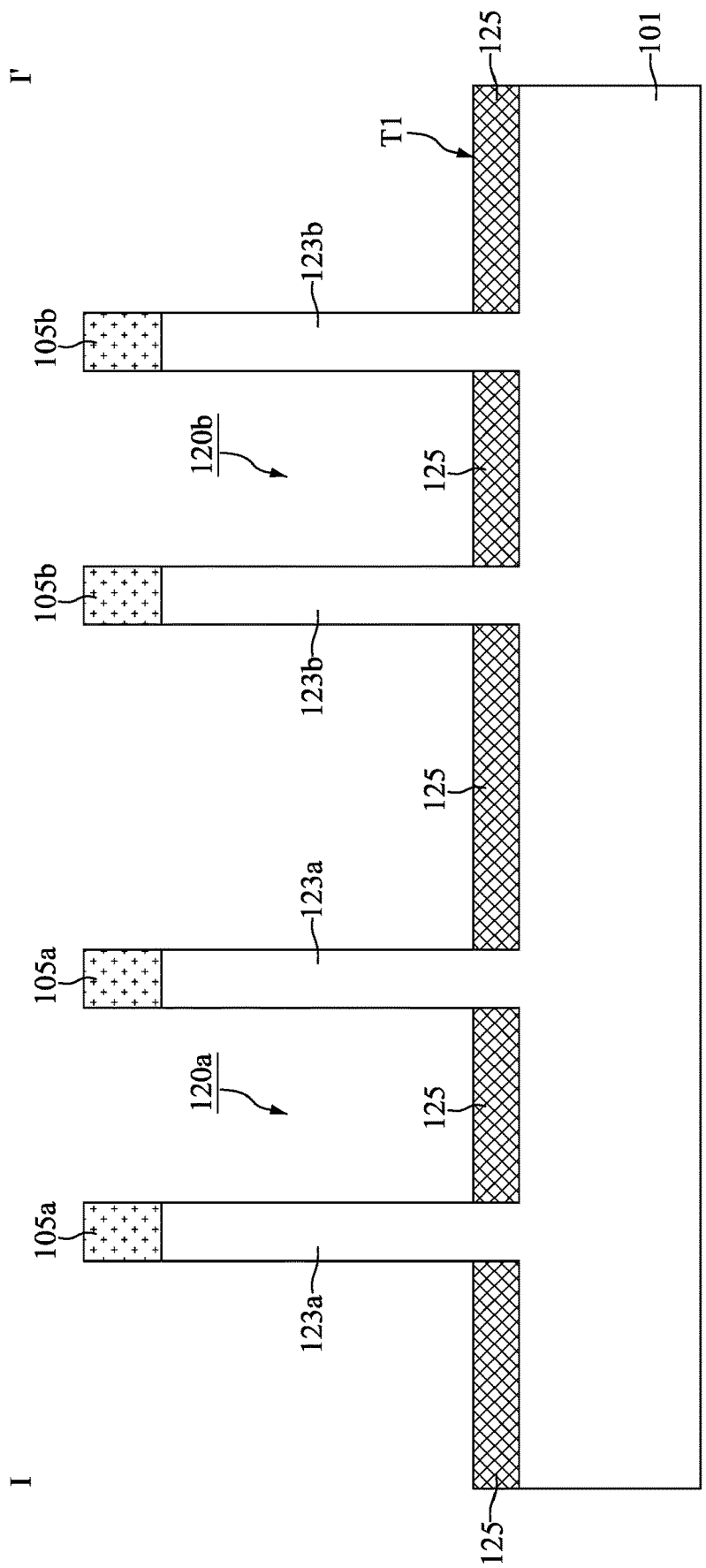
FIG. 7 is a cross-sectional view illustrating an intermediate stage of forming a processed area during the formation of the semiconductor device, in accordance with some embodiments.

FIG. 7 is a cross-sectional view illustrating an intermediate stage of forming a processed area 125 during the formation of the semiconductor device 100, in accordance with some embodiments. The respective step is illustrated as the step S15 in the method 10 shown in FIG. 1. The processed area 125 is formed by performing an ion implantation process on the semiconductor substrate 101, as shown in FIG. 7 in accordance with some embodiments.

In some embodiments, dopants are implanted into the top surface T1 of the semiconductor substrate 101 exposed by the annular semiconductor fins 123a and 123b. In some embodiments, P-type dopants, such as boron (B), gallium (Ga), or indium (In), or N-type dopants, such as phosphorous (P) or arsenic (As), can be implanted to form the processed area 125, depending on design requirements of the semiconductor device 100. It should be noted that the annular semiconductor fins 123a and 123b are covered by the ring structures 105a and 105b during the formation of the processed area 125.

Figure 8:
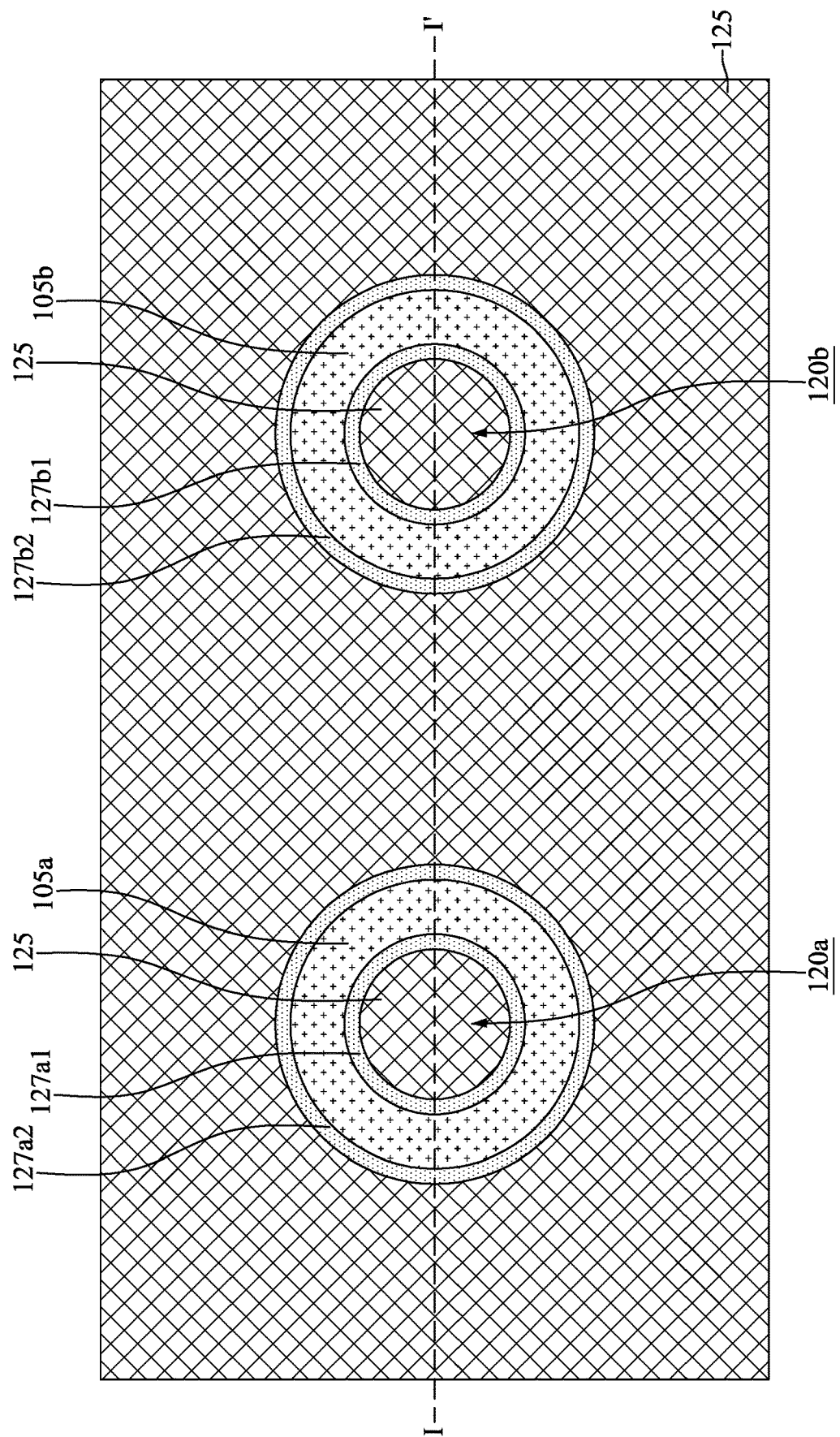
FIG. 8 is a top view illustrating an intermediate stage of forming inner spacers and outer spacers during the formation of the semiconductor device, in accordance with some embodiments.
Figure 9:
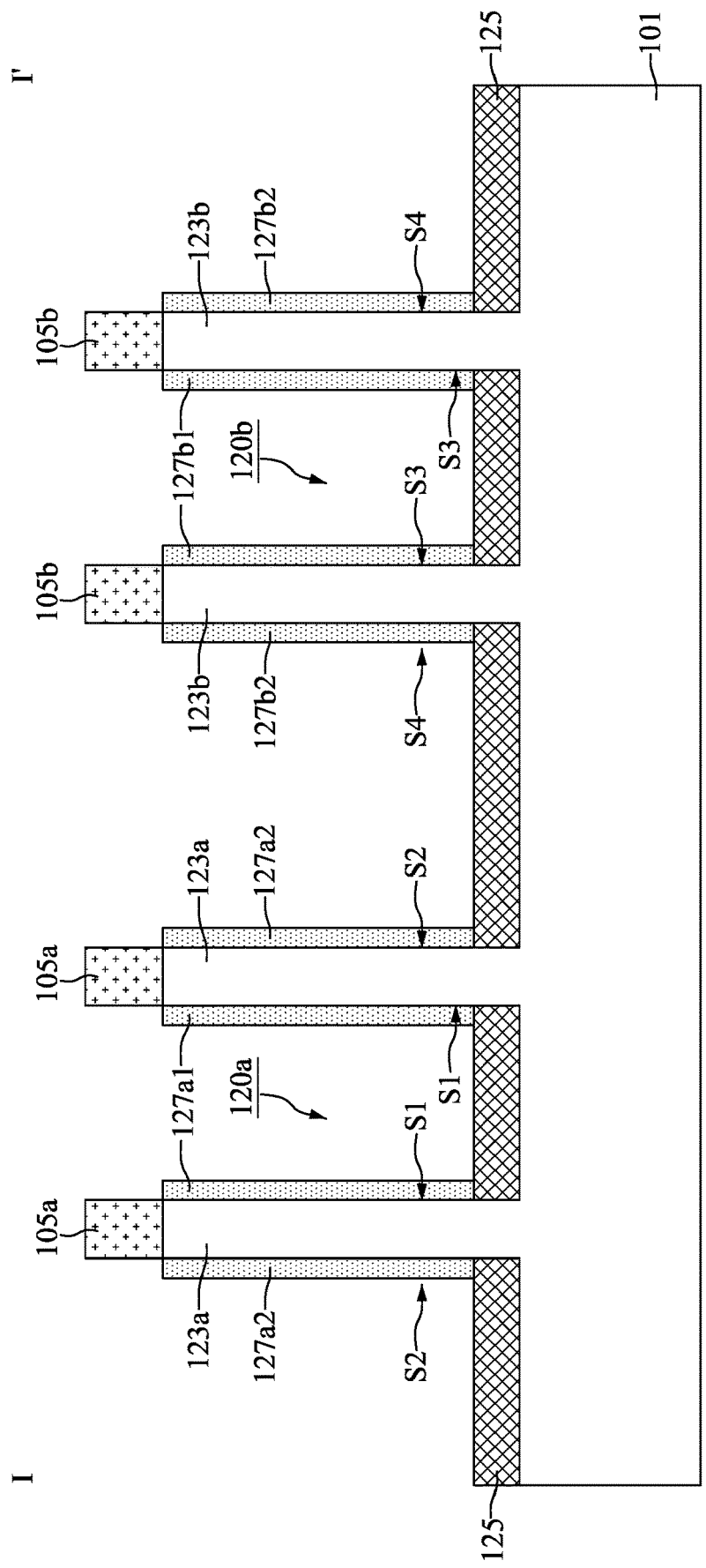
FIG. 9 is a cross-sectional view illustrating an intermediate stage of forming inner spacers and outer spacers during the formation of the semiconductor device along the sectional line I-I' in FIG. 8, in accordance with some embodiments.

FIG. 8 is a top view illustrating an intermediate stage of forming inner spacers 127a1, 127b1 and outer spacers 127a2, 127b2 during the formation of the semiconductor device 100, and FIG. 9 is cross-sectional view taken along the sectional line I-I' in FIG. 8, in accordance with some embodiments. The respective step is illustrated as the step S17 in the method 10 shown in FIG. 1.

More specifically, the inner spacer 127a1 is formed on and in direct contact with an inner sidewall S1 of the annular semiconductor fin 123a, and the outer spacer 127a2 is formed on and in direct contact with an outer sidewall S2 of the annular semiconductor fin 123a. Similarly, the inner spacer 127b1 is formed on and in direct contact with an inner sidewall S3 of the annular semiconductor fin 123b, and the outer spacer 127b2 is formed on and in direct contact with an outer sidewall S4 of the annular semiconductor fin 123b. In other words, the inner spacers 127a1 and 127b1 are formed in the openings 120a and 120b, respectivelly. In some embodiments, the processed area 125 is partially covered by the inner spacers 127a1, 127b1 and the outer spacers 127a2, 127b2.

In some embodiments, the inner spacers 127a1, 127b1 and the outer spacers 127a2, 127b2 are made of dielectric materials. In some embodiments, the inner spacers 127a1, 127b1 and the outer spacers 127a2, 127b2 include silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof. In some embodiments, the materials of the inner spacers 127a1, 127b1 and the materials of the outer spacers 127a2, 127b2 are different from the materials of the ring structures 105a and 105b. In some embodiments, the materials of the inner spacers 127a1, 127b1 and the materials of the outer spacers 127a2, 127b2 are the same. In addition, the inner spacers 127a1, 127b1 and the outer spacers 127a2, 127b2 are formed by selectively growing or depositing a dielectric material over the sidewalls of the annular semiconductor fins 123a, 123b. In some embodiments, the inner spacers 127a1, 127b1 and the outer spacers 127a2, 127b2 are formed by an epitaxial (epi) process.

Figure 11:
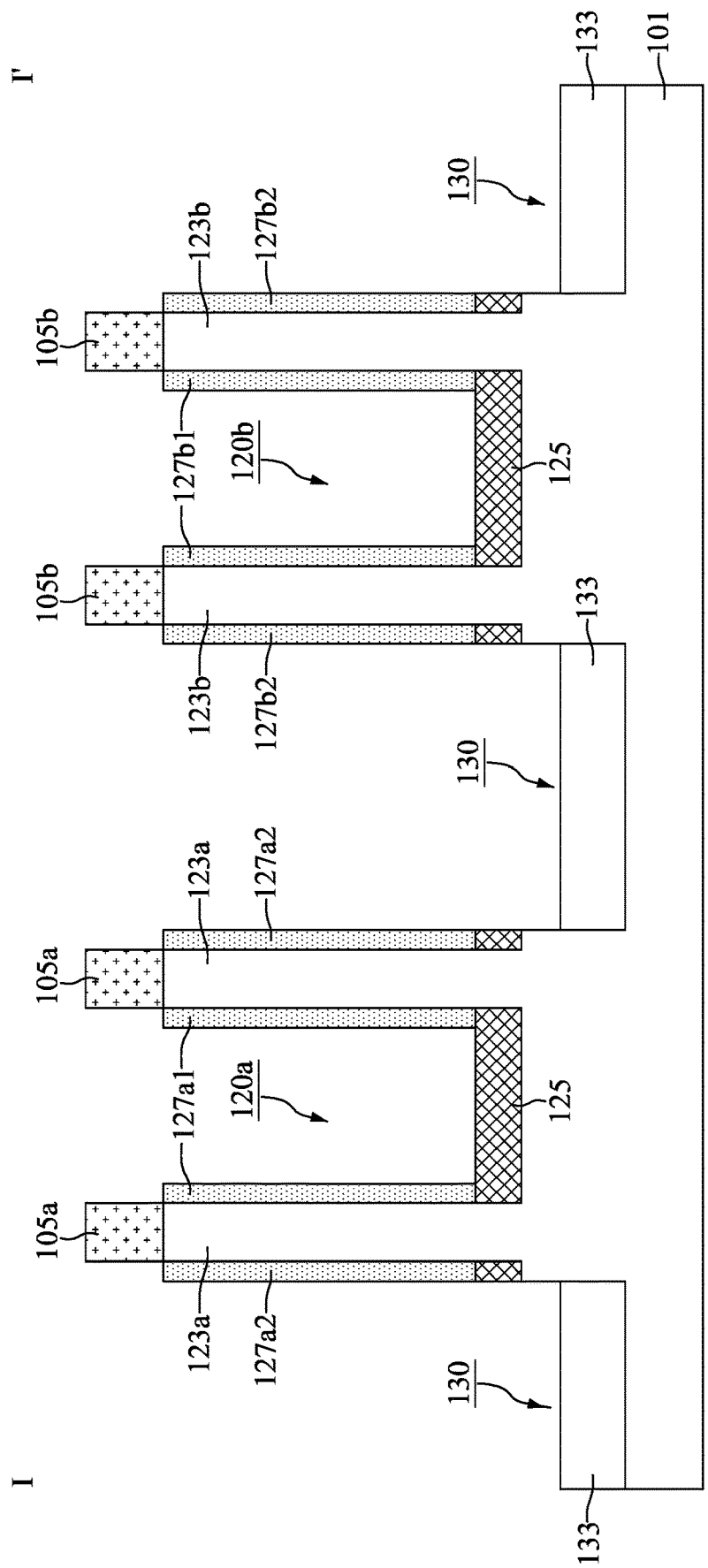
FIG. 11 is a cross-sectional view illustrating an intermediate stage of forming an isolation structure in the recess during the formation of the semiconductor device, in accordance with some embodiments.
Figure 12:
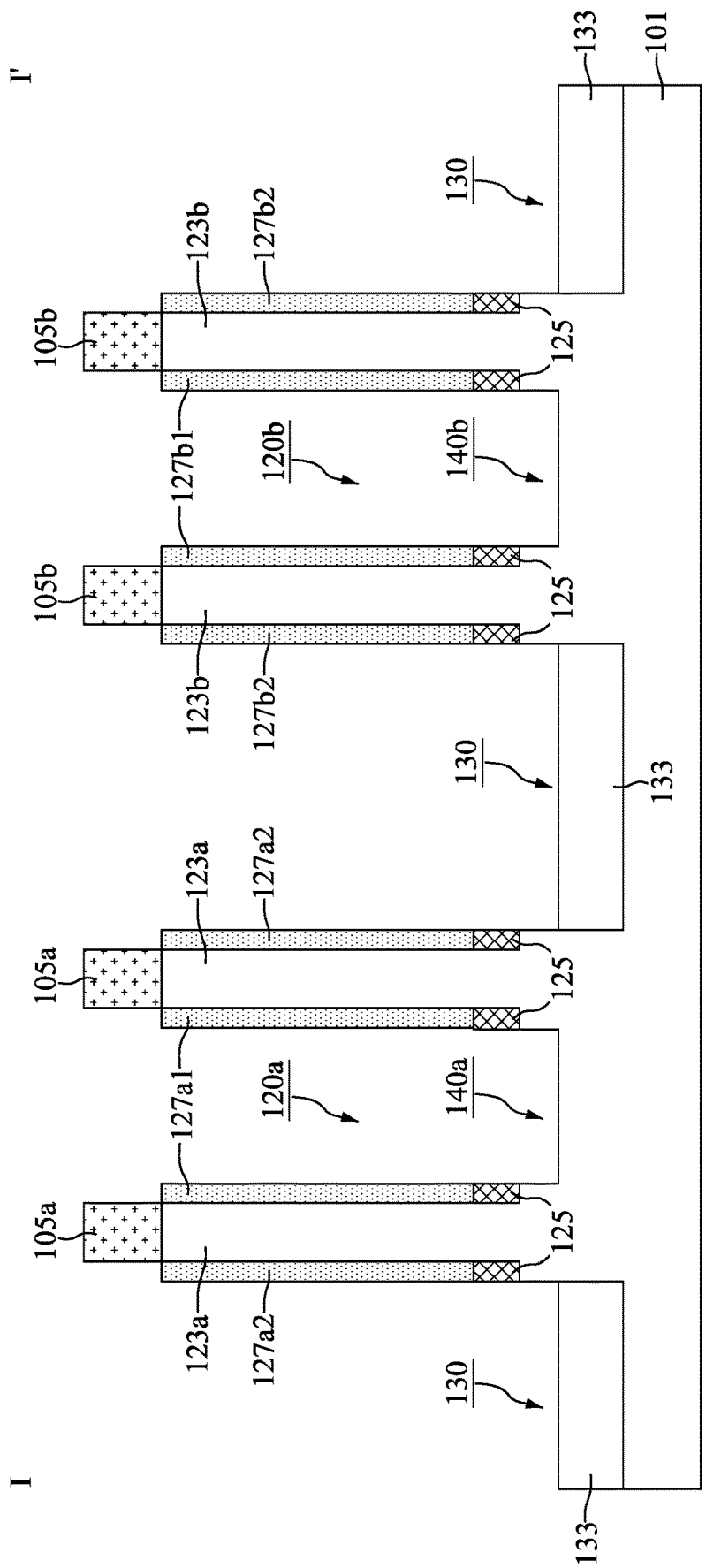
FIG. 12 is a cross-sectional view illustrating an intermediate stage of etching the semiconductor substrate to form recesses within the annular semiconductor fins during the formation of the semiconductor device, in accordance with some embodiments.
Figure 13:
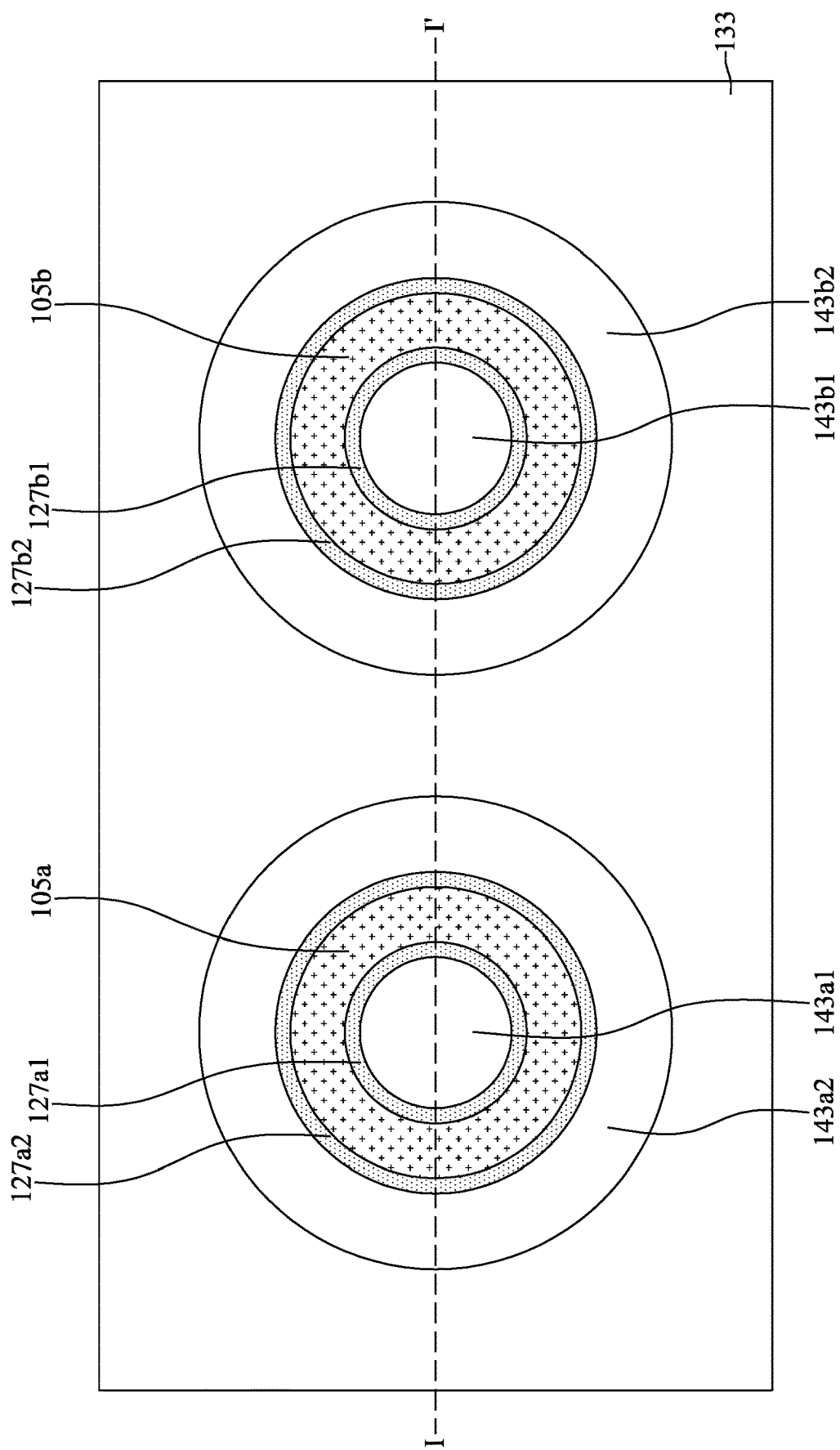
FIG. 13 is a top view illustrating an intermediate stage of forming first and second bottom source/drain structures during the formation of the semiconductor device, in accordance with some embodiments.
Figure 14:
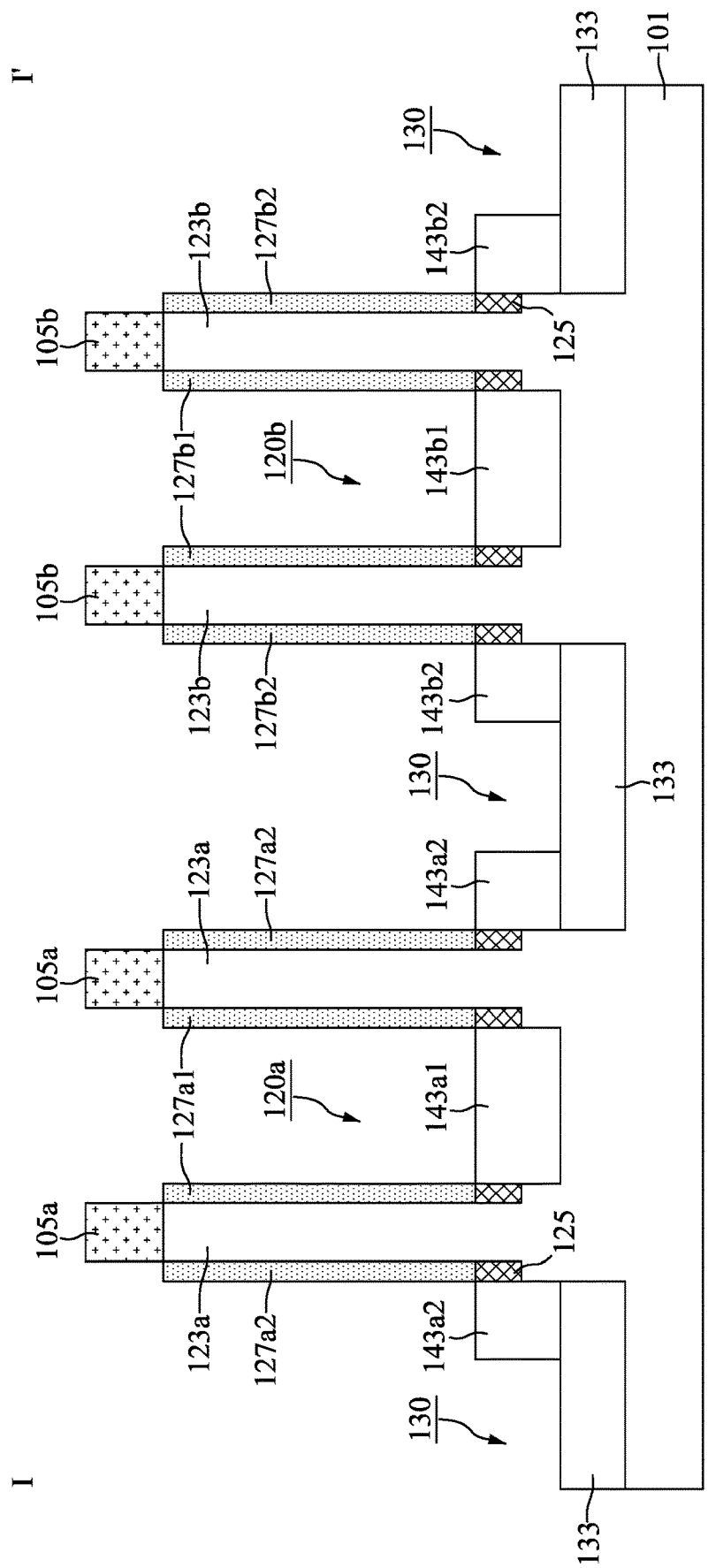
FIG. 14 is a cross-sectional view illustrating an intermediate stage of forming first and second bottom source/drain structures during the formation of the semiconductor device along the sectional line I-I' in FIG. 13, in accordance with some embodiments.

FIGS. 10, 11, 12, and 14 are cross-sectional views illustrating intermediate stages of epitaxially growing bottom source/drain structures 143a1, 143a2, 143b1, 143b2 during the formation of the semiconductor device 100, and FIG. 14 is a cross-sectional view taken along the sectional line I-I' in the top view of FIG. 13, in accordance with some embodiments. The respective step is illustrated as the step S19 in the method 10 shown in FIG. 1.

Figure 10:
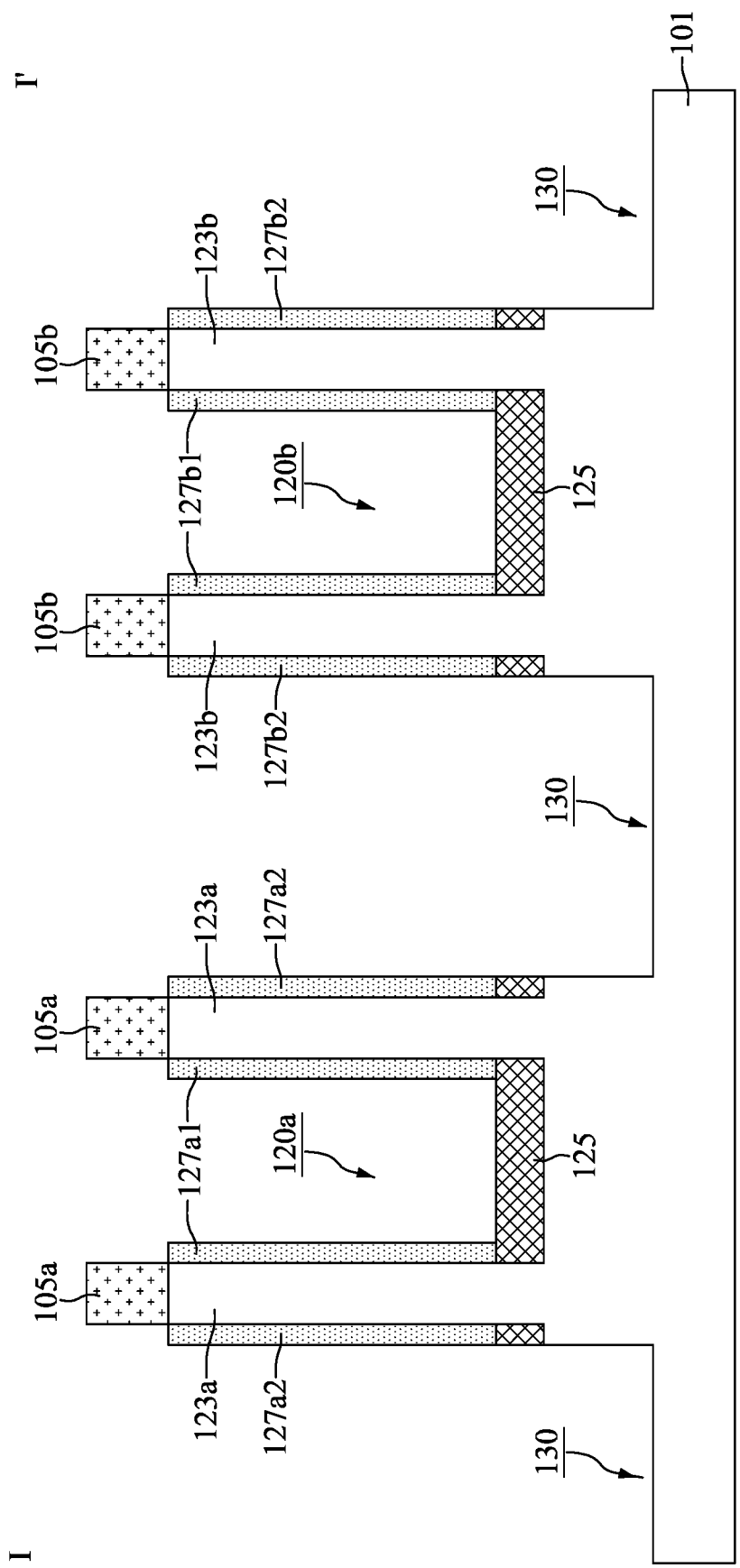
FIG. 10 is a cross-sectional view illustrating an intermediate stage of etching the semiconductor substrate to form a recess surrounding the annular semiconductor fins during the formation of the semiconductor device, in accordance with some embodiments.

As shown in FIG. 10, the semiconductor substrate 101 is etched to form a recess 130 surrounding the annular semiconductor fins 123a and 123b, in accordance with some embodiments. In some embodiments, the processed area 125 in the semiconductor substrate 101 is partially etched. In some embodiments, the recess 130 is formed by a dry etching process, such as a directional reactive-ion etching (RIE) process. In some embodiments, portions of the semiconductor substrate 101 (including the processed area 125) surrounded by the annular semiconductor fins 123a and 123b are not recessed by the etching process due to the loading effect.

Next, an isolation structure 133 is formed in the recess 130, as shown in FIG. 11 in accordance with some embodiments. In some embodiments, the isolation structure 133 is made of an insulating material, such as silicon oxide, silicon nitride, silicon oxynitride or another applicable dielectric material. In some embodiments, an insulating material (not shown) is deposited in the recess 130, and an etch-back process is performed on the insulating material to form the isolation structure 133. In some embodiments, the top surface of the isolation structure 133 is lower than the top surface of the processed area 125.

After the isolation structure 133 is formed, the semiconductor substrate 101 is etched to form recesses 140a and 140b within the annular semiconductor fins 123a and 123b, as shown in FIG. 12 in accordance with some embodiments. In some embodiments, portions of the semiconductor substrate 101 (including the processed area 125) within the annular semiconductor fins 123a and 123b are etched by using the ring structures 105a, 105b, the inner spacers 127a1, 127b1, and the outer spacers 127a2, 127b2 as a mask, and the portion of the semiconductor substrate 101 covered by the isolation structure 133 is protected by the isolation structure 133. In some embodiments, the etching process includes a dry etching process, such as an RIE process.

In some embodiments, the portions of the semiconductor substrate 101 within the annular semiconductor fins 123a and 123b are recessed to be coplanar with the isolation structure 133. However, other recess dimensions are applicable as well. In some embodiments, the sidewalls of the processed area 125 are exposed by the recesses 130, 140a, and 140b.

After the recesses 130, 140a, and 140b are formed in the semiconductor substrate 101 and below the annular semiconductor fins 123a and 123b, first bottom source/drain structures 143a1, 143b1 are epitaxially grown in the recesses 140a, 140b (see FIG. 12), respectively, and second bottom source/drain structures 143a2, 143b2 are epitaxially grown in the recess 130, as shown in FIGS. 13 and 14 in accordance with some embodiments. In some embodiments, the first bottom source/drain structure 143a1 is within the annular semiconductor fin 123a, and the second source/drain structure 143a2 is surrounding the annular semiconductor fin 123a. Similarly, the first bottom source/drain structure 143b1 is within the annular semiconductor fin 123b, and the second source/drain structure 143b2 is surrounding the annular semiconductor fin 123b.

In some embodiments, the inner spacer 127a1 and the outer spacer 127a2 are between the first bottom source/drain structure 143a1 and the second bottom source/drain structure 143a2, and the inner spacer 127b1 and the outer spacer 127b2 are between the first bottom source/drain structure 143b1 and the second bottom source/drain structure 143b2. In some embodiments, the first bottom source/drain structures 143a1, 143b1 and the second bottom source/drain structures 143a2, 143b2 are in direct contact with the processed area 125, and the second bottom source/drain structures 143a2, 143b2 cover a portion of the isolation structure 133.

In some embodiments, a strained material is grown over the recessed portions of the semiconductor substrate 101 by an epitaxial process to form the first bottom source/drain structures 143a1, 143b1 and the second bottom source/drain structures 143a2, 143b2. In some embodiments, the first bottom source/drain structures 143a1, 143b1 and the second bottom source/drain structures 143a2, 143b2 include Ge, SiGe, InAs, InGaAs, InSb, GaAs, GaSb, InATP, InP, or the like. The epitaxial process may include a rapid thermal chemical vapor deposition (RTCVD) process, an ultra-high vacuum chemical vapor deposition (UHVCVD) process, a molecular beam epitaxy (MBE) process, a metal organic CVD (MOCVD) or another applicable process.

Figure 15:
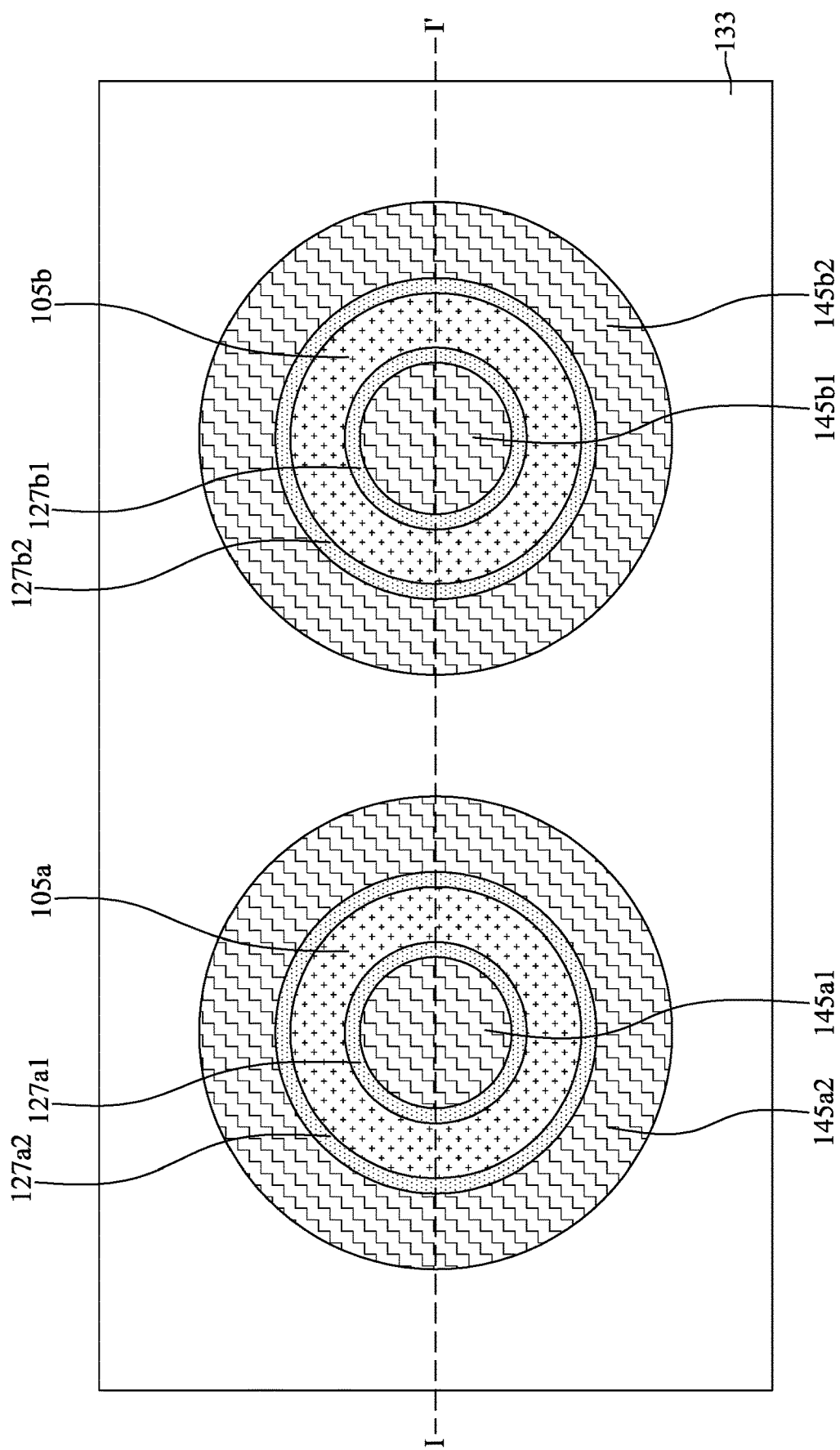
FIG. 15 is a top view illustrating an intermediate stage of forming first and second silicide layers during the formation of the semiconductor device, in accordance with some embodiments.
Figure 16:
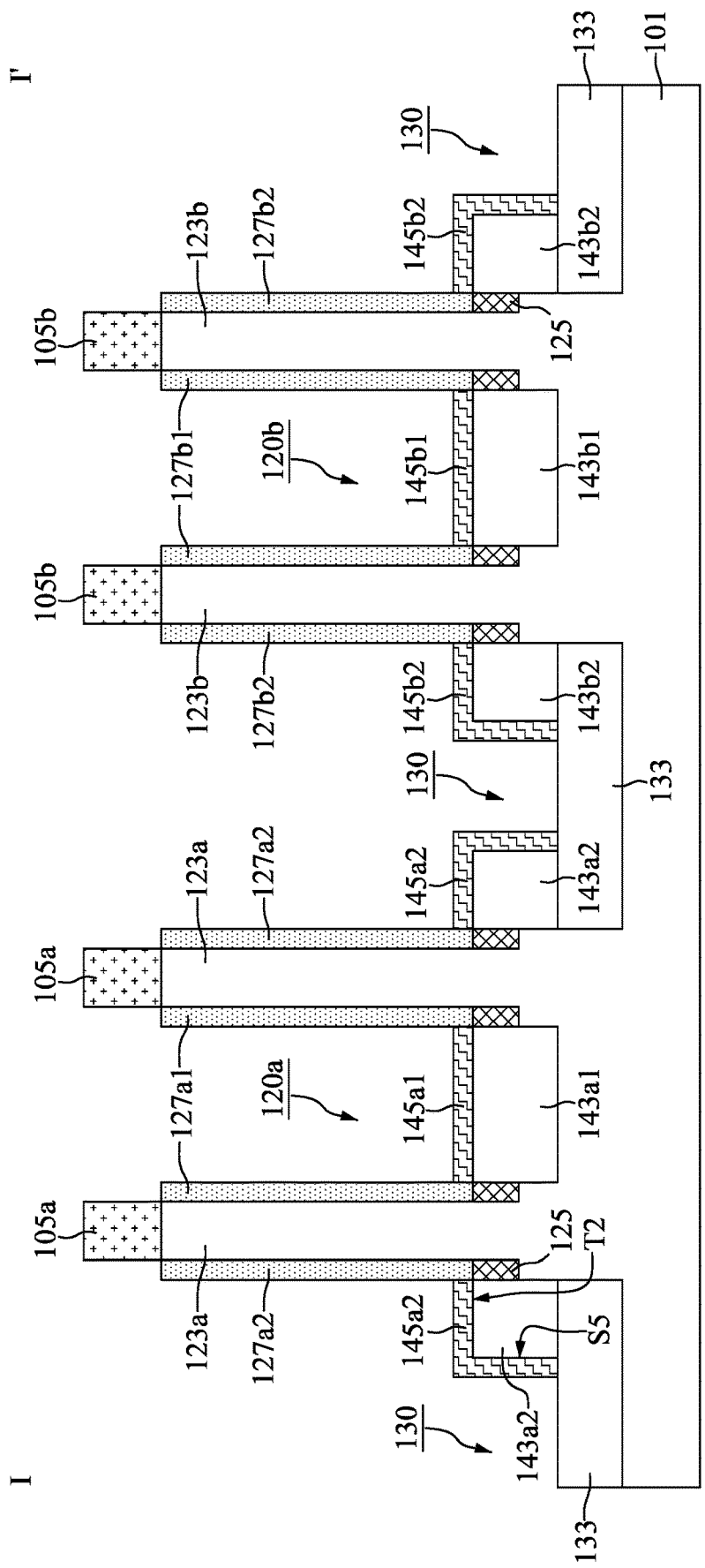
FIG. 16 is a cross-sectional view illustrating an intermediate stage of forming first and second silicide layers during the formation of the semiconductor device along the sectional line I-I' in FIG. 15, in accordance with some embodiments.

FIG. 15 is a top view illustrating an intermediate stage of forming first silicide layers 145a1, 145b1 and second silicide layers 145a2, 145b2 during the formation of the semiconductor device 100, and FIG. 16 is cross-sectional view taken along the sectional line I-I' in FIG. 15, in accordance with some embodiments. The respective step is illustrated as the step S21 in the method 10 shown in FIG. 1. The first silicide layer 145a1 is formed to cover the first bottom source/drain structure 143a1, and the second silicide layer 145a2 is formed to cover and surround the second bottom source/drain structure 143a2. Similarly, the first silicide layer 145b1 is formed to cover the first bottom source/drain structure 143b1, and the second silicide layer 145b2 is formed to cover and surround the second bottom source/drain structure 143b2.

In some embodiments, the first silicide layer 145a1 is in direct contact with the top surface of the first bottom source/drain structure 143a1, and the second silicide layer 145a2 is in direct contact with the top surface and sidewalls of the second bottom source/drain structure 143a2, such as the top surface T2 and the sidewall S5 of the second bottom source/drain structure 143a2 as shown in FIG. 16. The first silicide layer 145b1, the first bottom source/drain structure 143b1, the second silicide layer 145b2, and the second bottom source/drain structure 143b2 have similar features as the above-mentioned features of the first silicide layer 145a1, the first bottom source/drain structure 143a1, the second silicide layer 145a2, and the second bottom source/drain structure 143a2, and details thereof are not repeated herein.

Moreover, in some embodiments, the first silicide layers 145a1 and 145b1 are in direct contact with the inner spacers 127a1 and 127b1, respectively, and the second silicide layers 145a2 and 145b2 are in direct contact with the outer spacers 127a2 and 127b2, respectively. It should be noted that the first silicide layers 145a1 and 145b1 and the second silicide layers 145a2 and 145b2 are used to reduce contact resistance between the bottom source/drain structures and the contacts which will later be formed over the bottom source/drain structures.

In some embodiments, the first silicide layers 145a1, 145b1 and the second silicide layers 145a2, 145b2 are made of a metal silicide material, such as cobalt silicide, titanium silicide, tantalum silicide, nickel silicide, copper silicide, tungsten silicide, molybdenum silicide, or another applicable material. In addition, the first silicide layers 145a1, 145b1 and the second silicide layers 145a2, 145b2 may be formed by a silicidation process. In some embodiments, the silicidation process includes a metal material deposition process and an annealing process performed in sequence. In some embodiments, the deposition process of the silicidation process includes a PVD process, an ALD process, or another applicable process. In some embodiments, the annealing process of the silicidation process is performed at a temperature in a range from about 400° C. to about 700° C. After the annealing process, the unreacted metal material is removed.

Figure 17:
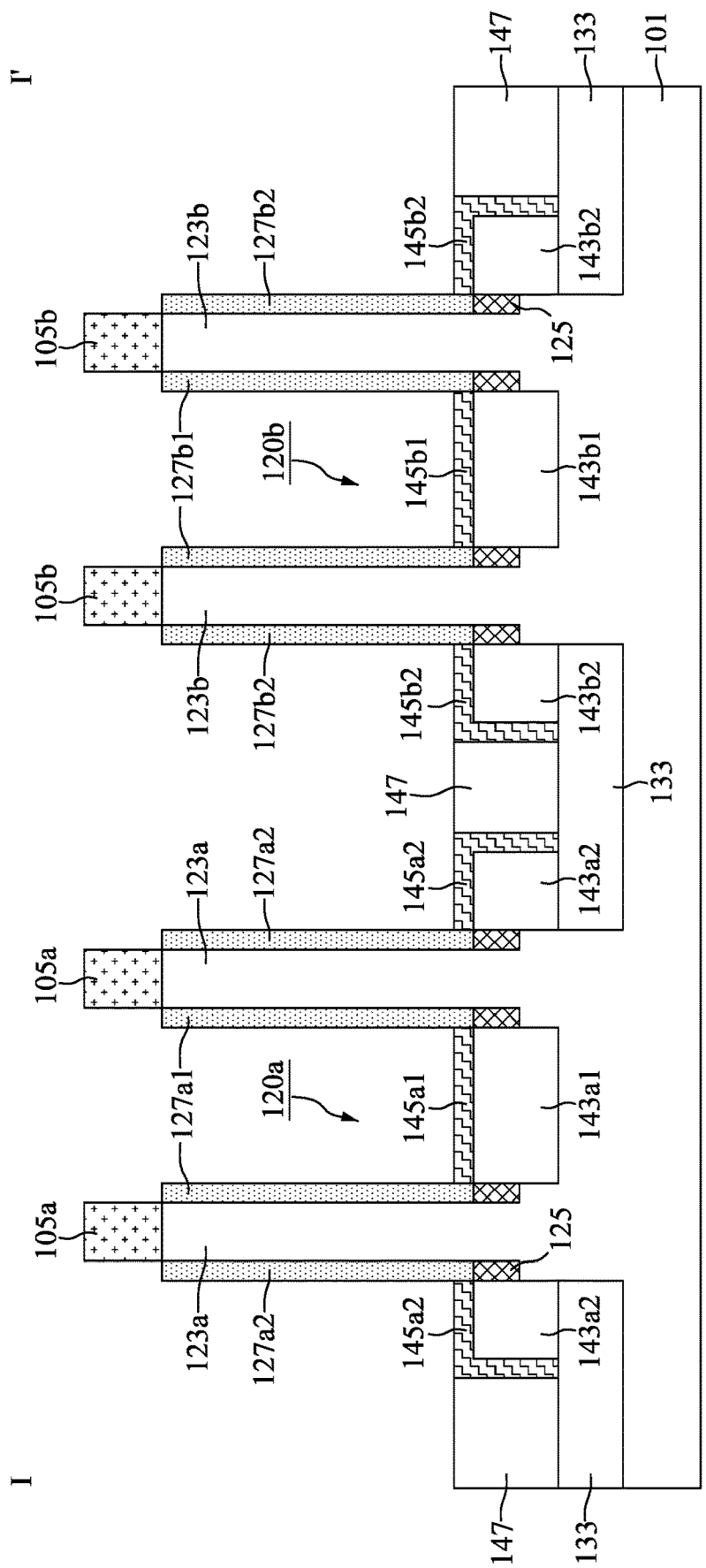
FIG. 17 is a cross-sectional view illustrating an intermediate stage of forming an interlayer dielectric (ILD) layer to surround the second silicide layers during the formation of the semiconductor device, in accordance with some embodiments.

FIG. 17 is a cross-sectional view illustrating an intermediate stage of forming an interlayer dielectric (ILD) layer 147 to surround the second silicide layers 145a2, 145b2 during the formation of the semiconductor device 100, in accordance with some embodiments. As shown in FIG. 17, the ILD layer 147 is formed to fill the remaining space of the recess 130, in accordance with some embodiments.

In some embodiments, the ILD layer 147 may include multilayers made of multiple dielectric materials, such as silicon oxide, silicon nitride, silicon oxynitride, tetraethoxysilane (TEOS) oxide, phosphosilicate glass (PSG), borophosphosilicate glass (BPSG), low-k dielectric material, and/or other applicable dielectric materials. The ILD layer 147 may be formed by a CVD process, a PVD process, an ALD process, a spin-on coating process, or another applicable process. Afterwards, a planarization process, such as a chemical mechanical polishing (CMP) process, is performed on the ILD layer 147 until the top surfaces of the second silicide layers 145a2 and 145b2 are exposed.

Figure 18:
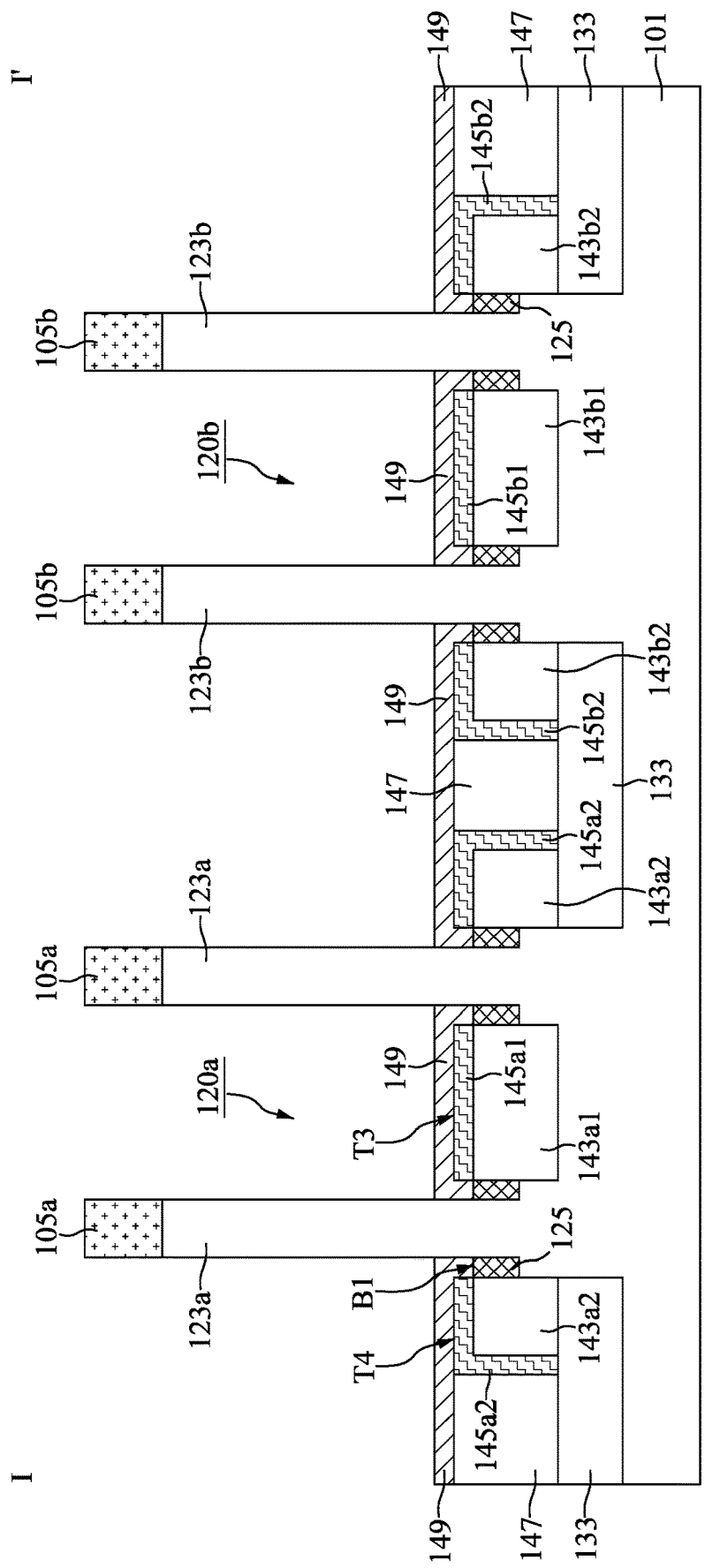
FIG. 18 is a cross-sectional view illustrating an intermediate stage of forming a bottom spacer layer to cover the first and the second silicide layers during the formation of the semiconductor device, in accordance with some embodiments.

FIG. 18 is a cross-sectional view illustrating an intermediate stage of removing the inner spacers 127a1, 127b1 and the outer spacers 127a2, 127b2, and forming a bottom spacer layer 149 to cover the first silicide layers 145a1, 145b1 and the second silicide layers 145a2, 145b2 during the formation of the semiconductor device 100, in accordance with some embodiments. The respective step is illustrated as the step S23 in the method 10 shown in FIG. 1. In some embodiments, after the inner spacers 127a1, 127b1 and the outer spacers 127a2, 127b2 are removed, annular gaps (not shown) are formed within the annular semiconductor fins 123a and 123b, and surrounding the annular semiconductor fins 123a and 123b.

In some embodiments, the inner spacers 127a1, 127b1 and the outer spacers 127a2, 127b2 are removed by a selective etching process, such as an RIE process. The removal of the inner spacers 127a1, 127b1 and the outer spacers 127a2, 127b2 exposes the sidewalls of the annular semiconductor fins 123a and 123b (i.e., the inner sidewalls S1, S3 and the outer sidewalls S2, S4 shown in FIG. 9). Then, the bottom spacer layer 149 is deposited over the first silicide layers 145a1, 145b1 and the second silicide layers 145a2, 145b2, and portions of the bottom spacer layer 149 extend into the annular gaps between the first silicide layers 145a1, 145b1, the second silicide layers 145a2, 145b2 and the annular semiconductor fins 123a, 123b, as shown in FIG. 18 in accordance with some embodiments.

In some embodiments, the bottom spacer layer 149 is made of a dielectric material, such as silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof. In addition, the bottom spacer layer 149 is formed by a directional deposition process, such as a high density plasma (HDP) deposition process, a gas cluster ion beam (GCIB) deposition process, or another applicable deposition process. The directional deposition process deposits the material of the bottom spacer layer 149 preferably on the exposed horizontal surfaces, but not on the lateral sidewalls. The material of the bottom spacer layer 149 formed over the top surfaces of the ring structures 105a and 105b will later be removed during subsequent planarization process, such as a CMP process.

Figure 19:
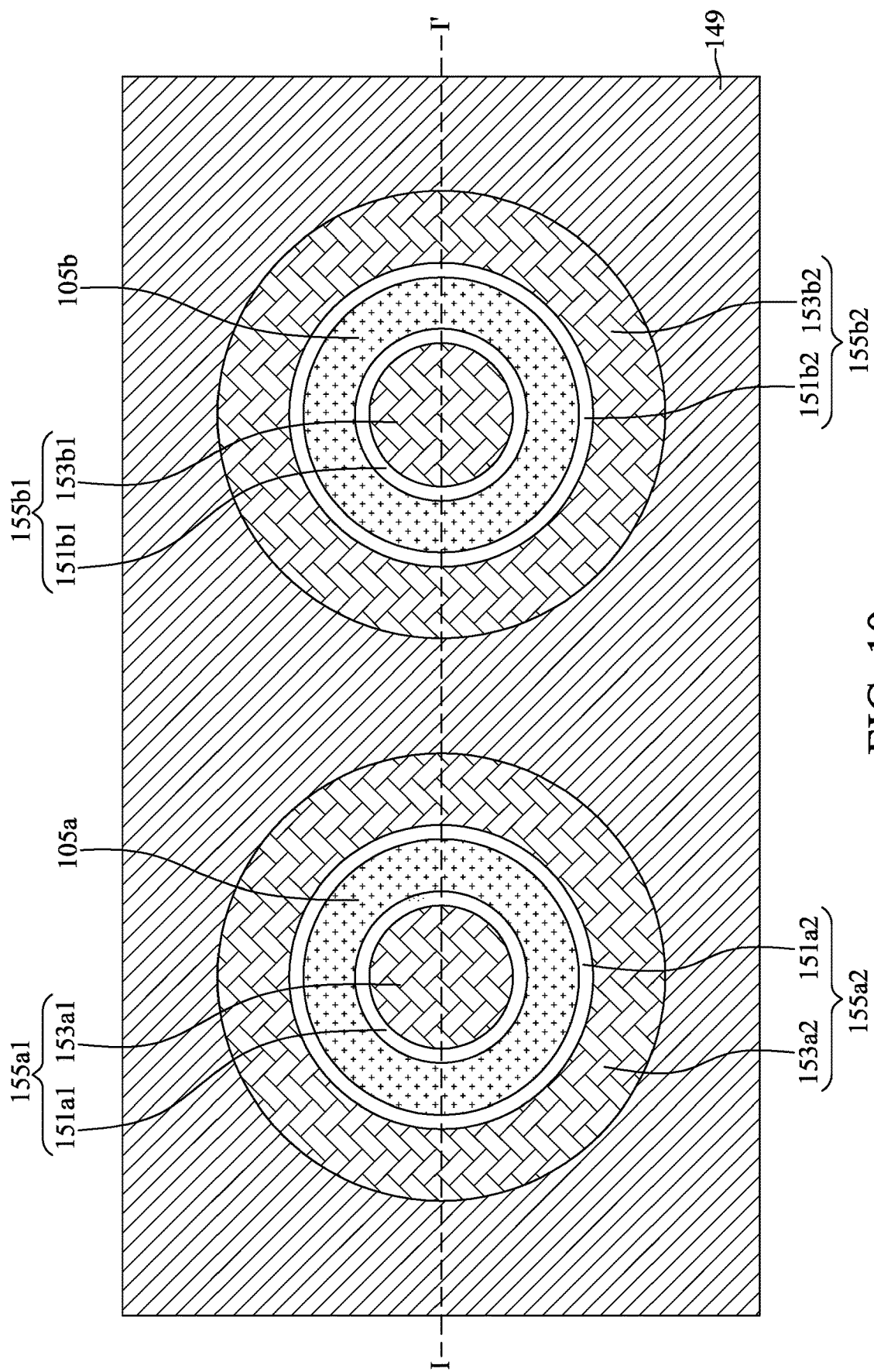
FIG. 19 is a top view illustrating an intermediate stage of forming first and second gate structures during the formation of the semiconductor device, in accordance with some embodiments.
Figure 20:
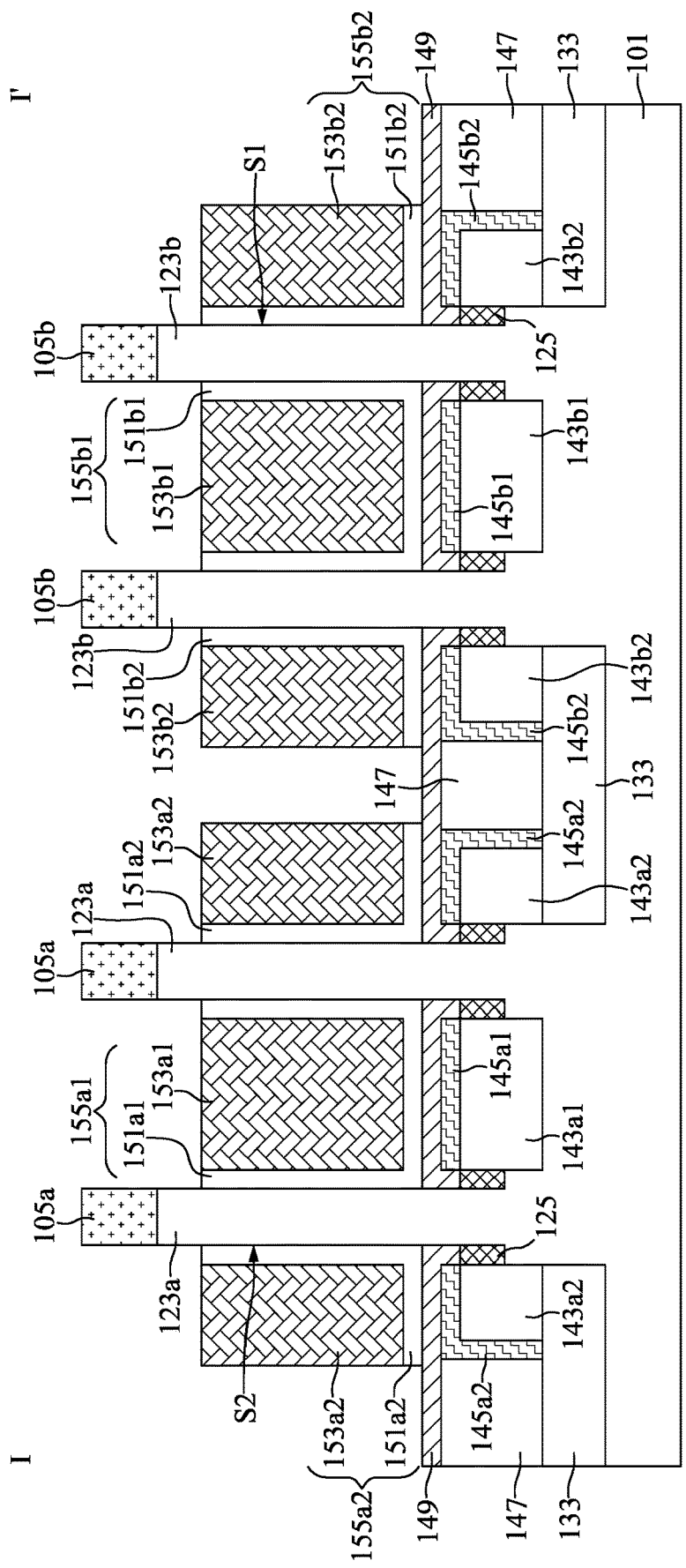
FIG. 20 is a cross-sectional view illustrating an intermediate stage of forming first and second gate structures during the formation of the semiconductor device along the sectional line I-I' in FIG. 19, in accordance with some embodiments.

FIG. 19 is a top view illustrating an intermediate stage of forming first gate structures 155a1, 155b1 and second gate structures 155a2, 155b2 during the formation of the semiconductor device 100, and FIG. 20 is cross-sectional view taken along the sectional line I-I' in FIG. 19, in accordance with some embodiments. The respective step is illustrated as the step S25 in the method 10 shown in FIG. 1. The first gate structure 155a1 includes a gate dielectric layer 151a1 and a gate electrode layer 153a1, and the second gate structure 155a2 includes a gate dielectric layer 151a2 and a gate electrode layer 153a2. Similarly, the first gate structure 155b1 includes a gate dielectric layer 151b1 and a gate electrode layer 153b1, and the second gate structure 155b2 includes a gate dielectric layer 151b2 and a gate electrode layer 153b2.

In some embodiments, the gate electrode layers 153a1, 153a2, 153b1, and 153b2 are formed over the gate dielectric layers 151a1, 151a2, 151b1, and 151b2, and sidewalls of the gate electrode layers 153a1, 153a2, 153b1, and 153b2 are covered by the gate dielectric layers 151a1, 151a2, 151b1, and 151b2. In addition, work function layers (not shown) may be formed between each of the gate dielectric layers 151a1, 151a2, 151b1, and 151b2 and each of the gate electrode layers 153a1, 153a2, 153b1, and 153b2.

Each of the gate dielectric layers 151a1, 151a2, 151b1, and 151b2 may be a single layer or multiple layers. In some embodiments, the gate dielectric layers 151a1, 151a2, 151b1, and 151b2 are made of silicon oxide, silicon nitride, silicon oxynitride (SiON), dielectric material(s) with high dielectric constant (high-k), or a combination thereof. In some embodiments, the gate dielectric layers 151a1, 151a2, 151b1, and 151b2 are deposited by an ALD process, a plasma enhanced chemical vapor deposition (PECVD) process or a spin coating process.

Moreover, the gate electrode layers 153a1, 153a2, 153b1, and 153b2 are made of a conductive material such as aluminum (Al), copper (Cu), tungsten (W), titanium (Ti), tantalum (Ta), or another applicable material, in accordance with some embodiments. The gate electrode layers 153a1, 153a2, 153b1, and 153b2 may be formed by a deposition process, such as a CVD process, a PVD process, an ALD process, a high density plasma CVD (HDPCVD) process, an MOCVD process, or a PECVD process.

The work function layers (not shown) may be made of metal materials, and the metal materials may include N-work-function metal or P-work-function metal, depending on design requirements of the semiconductor device 100. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

After the materials of the gate dielectric layers 151a1, 151a2, 151b1, and 151b2 and the gate electrode layers 153a1, 153a2, 153b1, and 153b2 are deposited, excessive materials of the gate dielectric layers 151a1, 151a2, 151b1, and 151b2 and the gate electrode layers 153a1, 153a2, 153b1, and 153b2 are removed by a single etching process or multiple etching processes, such as dry etching processes, to form the first gate structures 155a1 and 155b1 within the annular semiconductor fins 123a and 123b, and the second gate structures 155a2 and 155b2 surrounding the annular semiconductor fins 123a and 123b. As a result, the inner sidewall S1 of the annular semiconductor fin 123a is in direct contact with the gate dielectric layer 151a1 of the first gate structure 155a1, and the outer sidewall S2 of the annular semiconductor fin 123a is in direct contact with the gate dielectric layer 151a2 of the second gate structure 155a2.

In some embodiments, the inner sidewall S1 and the outer sidewall S2 of the annular semiconductor fin 123a are partially exposed by the first gate structure 155a1 and the second gate structure 155a2. The annular semiconductor fin 123b, the first gate structure 155b1, and the second gate structure 155b2 have similar features as the above-mentioned features of the annular semiconductor fin 123a, the first gate structure 155a1, and the second gate structure 155a2, and details thereof are not repeated herein. In some embodiments, a portion of the bottom spacer layer 149 is exposed by the second gate structures 155a2 and 155b2.

Figure 21:
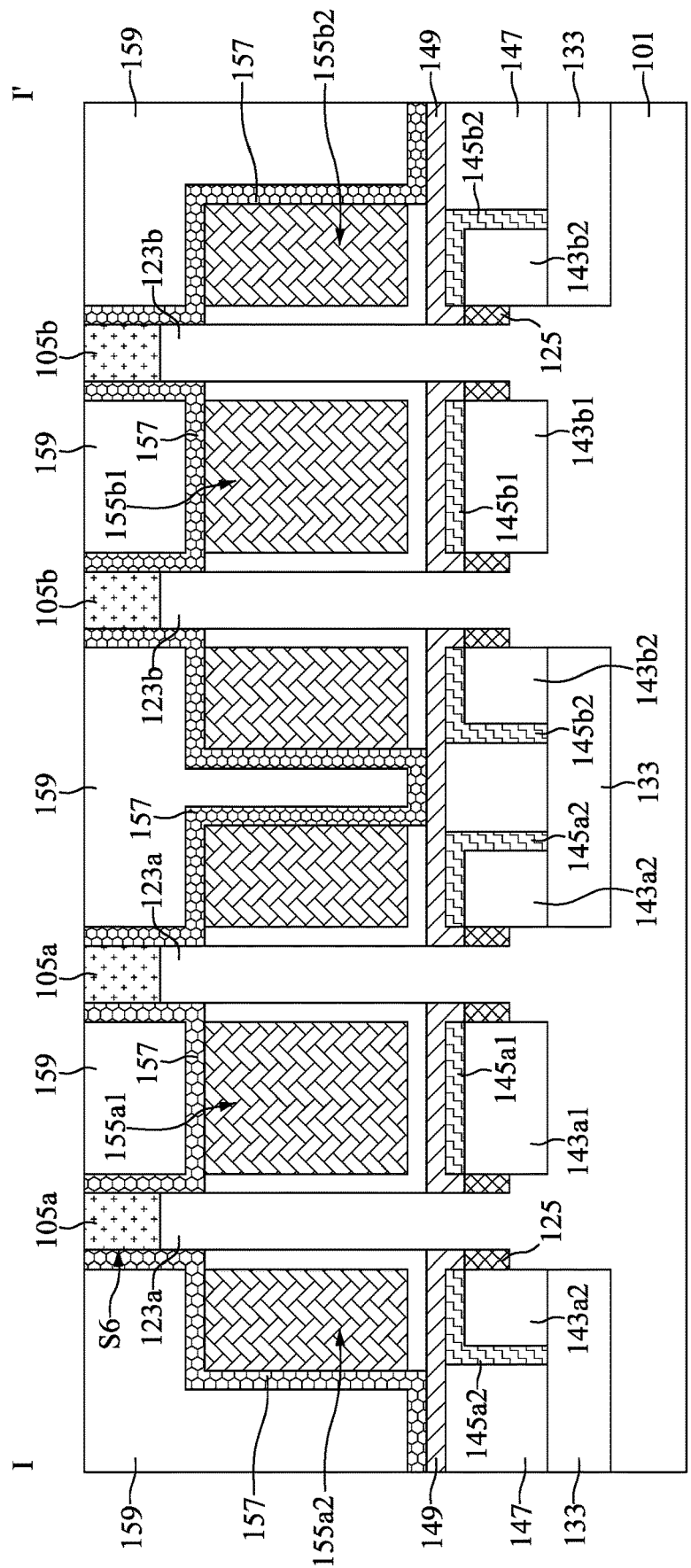
FIG. 21 is a cross-sectional view illustrating an intermediate stage of forming a top spacer layer and an ILD layer during the formation of the semiconductor device, in accordance with some embodiments.

FIG. 21 is a cross-sectional view illustrating an intermediate stage of forming a top spacer layer 157 and an ILD layer 159 over the structure of FIG. 20 during the formation of the semiconductor device 100, in accordance with some embodiments. After the first gate structures 155a1, 155b1 and the second gate structures 155a2, 155b2 are formed, they are enclosed by conformally depositing the top spacer layer 157, and the ILD layer 159 is deposited over and in direct contact with the top spacer layer 157, as shown in FIG. 21 in accordance with some embodiments. Some materials and processes used to form the top spacer layer 157 are similar to, or the same as, those used to form the bottom spacer layer 149, and details thereof are not repeated herein.

Moreover, some materials and processes used to form the ILD layer 159 are similar to, or the same as, those used to form the ILD layer 147, and details thereof are not repeated herein. However, it should be noted that, the materials of the top spacer layer 157 are different from the materials of the ILD layer 159. Afterwards, a planarization process, such as a CMP process, is performed on the ILD layer 159 until the top surfaces of the ring structures 105a and 105b are exposed. In some embodiments, portions of the top spacer layer 157 is in direct contact with portions of the bottom spacer layer 149.

Figure 22:
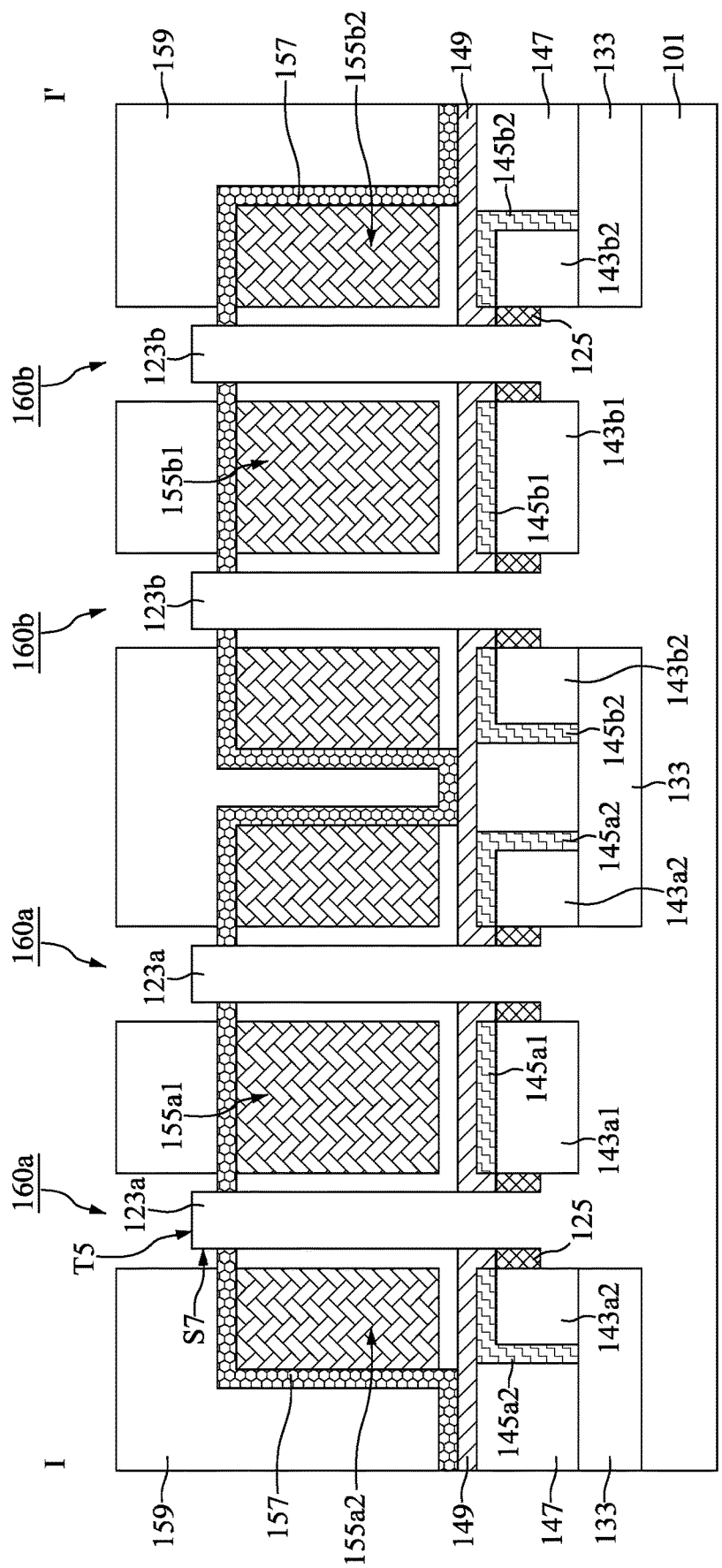
FIG. 22 is a cross-sectional view illustrating an intermediate stage of removing the ring structures and a portion of the top spacer layer during the formation of the semiconductor device, in accordance with some embodiments.

FIG. 22 is a cross-sectional view illustrating an intermediate stage of removing the ring structures 105a, 105b and portions of the top spacer layer 157 during the formation of the semiconductor device 100, in accordance with some embodiments. In some embodiments, the ring structures 105a, 105b and the vertical portions of the top spacer layer 157 that are in direct contact with sidewalls of both ring structures 105a, 105b and annular semiconductor fins 123a, 123b are removed. For example, a selective etching process, such as a wet etching process, may be used to remove the ring structures 105a, 105b and the above-mentioned portions of the top spacer layer 157.

As a result, annular openings 160a and 160b exposing the annular semiconductor fins 123a, 123b are obtained. Specifically, the top surface and a portion of the sidewalls of the annular semiconductor fin 123a are exposed by the annular opening 160a, and the top surface and a portion of the sidewalls of the annular semiconductor fin 123b are exposed by the annular opening 160b. For example, the top surface T5 and the top portion of the sidewall S7 of the annular semiconductor fin 123a are exposed by the annular opening 160a. In some embodiments, the remaining portions of the top spacer layer 157 are also exposed by the annular openings 160a and 160b.

Figure 23:
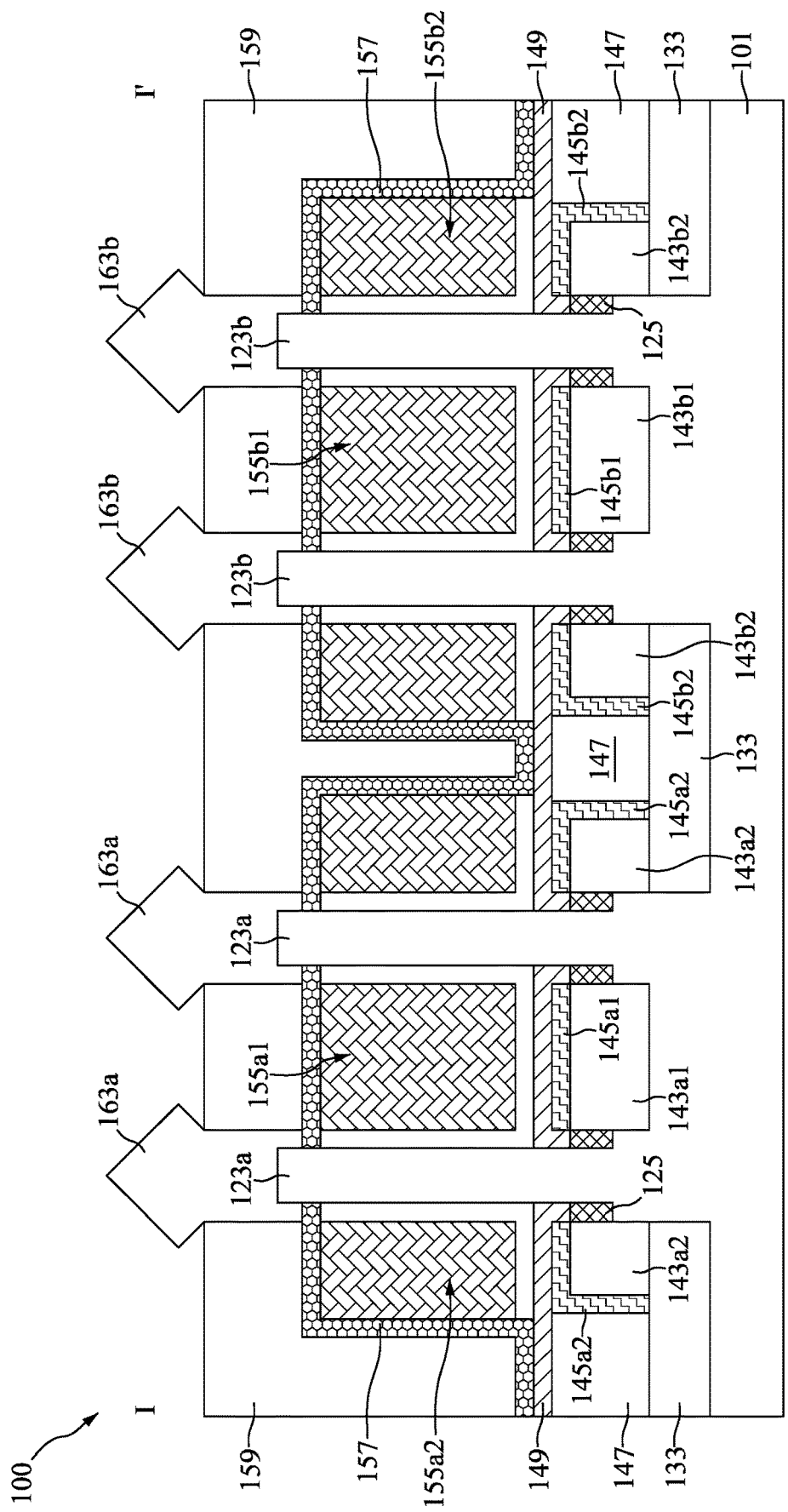
FIG. 23 is a cross-sectional view illustrating an intermediate stage of forming top source/drain structures during the formation of the semiconductor device, in accordance with some embodiments.

FIG. 23 is a cross-sectional view illustrating an intermediate stage of forming top source/drain structures 163a and 163b over the annular semiconductor fins 123a and 123b during the formation of the semiconductor device 100, in accordance with some embodiments. The respective step is illustrated as the step S27 in the method 10 shown in FIG. 1. In some embodiments, the top source/drain structures 163a and 163b are epitaxially grown in the annular openings 160a and 160b, respecitvely.

Some materials and processes used to form the top source/drain structures 163a and 163b are similar to, or the same as, those used to form the first bottom source/drain structures 143a1, 143b1 and the second bottom source/drain structures 143a2, 143b2, and details thereof are not repeated herein. In some embodiments, the top source/drain structures 163a and 163b are doped in-situ with P-type dopants, such as boron (B), or N-type dopants, such as phosphorous (P) during their epitaxial growth. In some other embodiments, the top source/drain structures 163a and 163b are not doped during their epitaxial growth. Instead, after the growth of the top source/drain structures 163a and 163b, the top source/drain structures 163a and 163b are doped in a subsequent process, such as an ion implantation process.

In particular, since the top source/drain structures 163a and 163b have slower growth rate on (111) oriented surface during their epitaxial growth, faceted top source/drain structures 163a and 163b are obtained, as shown in FIG. 23 in accordance with some embodiments. In some embodiments, the top source/drain structures 163a and 163b are in direct contact with the top surfaces and portions of the sidewalls of the annular semiconductor fins 123a and 123b. Moreover, the top source/drain structures 163a and 163b may be in direct contact with a portion of the top spacer layer 157. After the top source/drain structures 163a and 163b are grown, the semiconductor device 100 is obtained.

Embodiments of a method for preparing the semiconductor device 100 are provided in the disclosure. The method includes etching the semiconductor substrate 101 by using the ring structures 105a and 105b as a mask to form the annular semiconductor fins 123a and 123b, and forming the semiconductor device 100 (including vertical field effect transistors) by using the annular semiconductor fins 123a and 123b as vertical channels. As a result, the integration density of the semiconductor device 100 may be significantly increased.

Moreover, the method also includes forming the first gate structures 155a1 and 155b1 within the annular semiconductor fins 123a and 123b and forming the second gate structures 155a2 and 155b2 surrounding the annular semiconductor fins 123a and 123b. The first gate structures 155a1 and 155b1 may be used for current control in the vertical channels, and the second gate structures 155a2 and 155b2 may be configured to apply voltage bias to adjust the threshold voltages of the transistors. Since the first gate structures 155a1, 155b1 and the second gate structures 155a2, 155b2 may operate independently, the control of the current in the annular semiconductor fins 123a and 123b may be improved, thus upgrading the device performance.

Furthermore, by forming the second silicide layers 145a2 and 145b2 wrapping around the second bottom source/drain structures 143a2 and 143b2, the contact areas between the second silicide layers 145a2 and 145b2 and the second bottom source/drain structures 143a2 and 143b2 are increased. As a result, the contact resistances of the second bottom source/drain structures 143a2 and 143b2 may be decreased, which significantly improves the overall device performance.

In one embodiment of the present disclosure, a method for preparing a semiconductor device is provided. The method includes forming a ring structure over a semiconductor substrate, and etching the semiconductor substrate by using the ring structure as a mask to form an annular semiconductor fin. The method also includes epitaxially growing a first bottom source/drain structure within the annular semiconductor fin and a second bottom source/drain structure surrounding the annular semiconductor fin. The method further includes forming a first silicide layer over the first bottom source/drain structure and a second silicide layer over the second bottom source/drain structure. In addition, the method includes forming a first gate structure over the first silicide layer and a second gate structure over the second silicide layer, and epitaxially growing a top source/drain structure over the annular semiconductor fin.

In another embodiment of the present disclosure, a method for preparing a semiconductor device is provided. The method includes forming a tubular vertical fin over a semiconductor substrate, and forming an inner spacer on an inner sidewall of the tubular vertical fin and an outer spacer on an outer sidewall of the tubular vertical fin. The method also includes etching the semiconductor substrate to form a first recess and a second recess surrounding the first recess. The inner spacer and the outer spacer are between the first recess and the second recess. The method further includes epitaxially growing a first bottom source/drain structure in the first recess and a second bottom source/drain structure in the second recess. In addition, the method includes forming a first gate structure over the first bottom source/drain structure and a second gate structure over the second bottom source/drain structure, and epitaxially growing a top source/drain structure over the tubular vertical fin.

In yet another embodiment of the present disclosure, a method for preparing a semiconductor device is provided. The method includes forming a ring structure over a semiconductor substrate, and etching the semiconductor substrate by using the ring structure as a mask to form an annular vertical fin. The method also includes forming an inner spacer on an inner sidewall of the annular vertical fin and an outer spacer on an outer sidewall of the annular vertical fin. The method further includes etching the semiconductor substrate by using the ring structure, the inner spacer and the outer spacer as a mask to form a first recess within the annular vertical fin and a second recess surrounding the annular vertical fin. In addition, the method includes epitaxially growing a first bottom source/drain structure in the first recess and a second bottom source/drain structure in the second recess, and forming a first silicide layer to cover the first bottom source/drain structure and a second silicide layer to cover and surround the second bottom source/drain structure. The method also includes forming a first gate structure over the first silicide layer and a second gate structure over the second silicide layer, and epitaxially growing a top source/drain structure over the annular vertical fin.

The embodiments of the present disclosure have some advantageous features. By using a ring structure to form an annular semiconductor fin from a semiconductor substrate, and forming a transistor by using the annular semiconductor fin as a vertical channel, the integration density of the semiconductor device may be significantly increased. In addition, a gate structure formed within the annular semiconductor fin and a gate structure formed surrounding the annular semiconductor fin can operate independently, and silicide layers are formed wrapping around the bottom source/drain structures. Therefore, the overall device performance may be significantly improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
    forming a ring structure over a semiconductor substrate;
    etching the semiconductor substrate by using the ring structure as a mask to form an annular semiconductor fins;
    epitaxially growing a first bottom source/drain structure within the annular semiconductor fin and a second bottom source/drain structure surrounding the annular semiconductor fin;
    forming a first silicide layer over the first bottom source/drain structure and a second silicide layer over the second bottom source/drain structure;
    forming a first gate structure over the first silicide layer and a second gate structure over the second silicide layer; and
    epitaxially growing a top source/drain structure over the annular semiconductor fin;
    implanting dopants into a top surface of the semiconductor substrate exposed by the annular semiconductor fin to form a first processed area at an inner sidewall of the annular semiconductor fin and a second processed area at an outer sidewall of the annular semiconductor fin, wherein the first and second processed areas are formed on and in direct contact with the top surface of the semiconductor substrate; and
    after the first and second processed areas are formed, forming an inner spacer on the inner sidewall of the annular semiconductor fin and an outer spacer on the outer sidewall of the annular semiconductor fin;
    wherein a top side of the first processed area is covered by the inner spacer while two sides of the first processed area are covered by the inner sidewall of the annular semiconductor fin and a sidewall of the first bottom source/drain structure respectively;
    wherein a top side of the second processed area is covered by the outer spacer while two sides of the second processed area are covered by the outer sidewall of the annular semiconductor fin and a sidewall of the second bottom source/drain structure respectively.

2. The method for preparing the semiconductor device of claim 1, wherein the second silicide layer covers a top surface and an opposed sidewall of the second bottom source/drain structure.

3. The method for preparing the semiconductor device of claim 1, wherein the first gate structure is surrounded by the annular semiconductor fin, and the annular semiconductor fin is surrounded by the second gate structure.

4. The method for preparing the semiconductor device of claim 1, wherein the first gate structure and the second gate structure are in direct contact with sidewalls of the annular semiconductor fin.

5. The method for preparing the semiconductor device of claim 1, further comprising:
    removing the ring structure after the first gate structure and the second gate structure are formed to expose a top surface of the annular semiconductor fin.

6. The method for preparing the semiconductor device of claim 5, wherein the top source/drain structure is in direct contact with the top surface of the annular semiconductor fin.

7. The method for preparing the semiconductor device of claim 1,
    wherein a width of the first processed area equals to a width of the inner spacer and a width of the second processed area equals to a width of the inner spacer after the first bottom source/drain structure and the second bottom source/drain structure are grown.

8. The method for preparing the semiconductor device of claim 7, wherein the first and second processed areas are partially covered by the inner spacer and the outer spacer before the first bottom source/drain structure and the second bottom source/drain structure are grown.

9. A method for preparing a semiconductor device, comprising:
    forming a tubular vertical fin over a semiconductor substrate;
    forming an inner spacer on an inner sidewall of the tubular vertical fin and an outer spacer on an outer sidewall of the tubular vertical fin;
    etching the semiconductor substrate to form a first recess and a second recess surrounding the first recess, wherein the inner spacer and the outer spacer are between the first recess and the second recess;
    epitaxially growing a first bottom source/drain structure in the first recess and a second bottom source/drain structure in the second recess;
    forming a first processed area at the first recess and in direct contact with a top surface of the semiconductive substrate, wherein a top side of the first processed area is covered by the inner spacer while two sides of the first processed area are covered by the inner sidewall of the annular semiconductor fin and a sidewall of the first bottom source/drain structure respectively;
    forming a second processed area at the second recess and in direct contact with a top surface of the semiconductive substrate, wherein a top side of the second processed area is covered by the outer spacer while two sides of the second processed area are covered by the outer sidewall of the annular semiconductor fin and a sidewall of the second bottom source/drain structure respectively;
    forming a first gate structure over the first bottom source/drain structure and a second gate structure over the second bottom source/drain structure; and epitaxially growing a top source/drain structure over the tubular vertical fin.

10. The method for preparing the semiconductor device of claim 9, wherein forming the tubular vertical fin further comprises:
   forming a cylindrical structure over the semiconductor substrate;
   forming a ring structure surrounding and in direct contact with the cylindrical structure;
   removing the cylindrical structure to form an opening in the ring structure;
   performing an etching process on the semiconductor substrate by using the ring structure as a mask to form the tubular vertical fin.

11. The method for preparing the semiconductor device of claim 9, further comprising:
   implanting dopants into the top surface of the semiconductor substrate exposed by the tubular vertical fin to form the first and second processed areas before the inner spacer and the outer spacer are formed, wherein a width of the first processed area equals to a width of the inner spacer and a width of the second processed area equals to a width of the inner spacer after the first bottom source/drain structure and the second bottom source/drain structure are grown.

12. The method for preparing the semiconductor device of claim 9, further comprising:
   forming a first silicide layer over the first bottom source/drain structure and a second silicide layer over the second bottom source/drain structure before the first gate structure and the second gate structure are formed, wherein the second silicide layer covers and surrounds the second bottom source/drain structure.

13. The method for preparing the semiconductor device of claim 12, wherein the first silicide layer is in contact with the inner spacer, and the second silicide layer is in contact with the outer spacer.

14. The method for preparing the semiconductor device of claim 12, further comprising:
   removing the inner spacer and the outer spacer after the first silicide layer and the second silicide layer are formed;
   forming a bottom spacer layer to cover the first silicide layer and the second silicide layer; and
   forming a top spacer layer over the bottom spacer layer, wherein the first gate structure and the second gate structure are sandwiched between the bottom spacer layer and the top spacer layer.

* * * * *